(12) United States Patent
Fukuda et al.

(10) Patent No.: US 12,707,949 B2
(45) Date of Patent: Aug. 11, 2026

(54) MEMORY DEVICE

(71) Applicant: Kioxia Corporation, Tokyo (JP)

(72) Inventors: Natsuki Fukuda, Yokkaichi (JP); Tadashi Iguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 864 days.

(21) Appl. No.: 17/940,158

(22) Filed: Sep. 8, 2022

(65) Prior Publication Data

US 2023/0326859 A1 Oct. 12, 2023

(30) Foreign Application Priority Data

Mar. 24, 2022 (JP) ................................ 2022-048579

(51) Int. Cl.

*H10W 20/20* (2026.01)
*H10B 43/10* (2023.01)
*H10B 43/27* (2023.01)
*H10B 43/50* (2023.01)

(52) U.S. Cl.

CPC ............ *H10W 20/20* (2026.01); *H10B 43/27* (2023.02)

(58) Field of Classification Search

CPC ... H01L 23/535; H01L 23/5386; H10B 43/27; H10B 43/10; H10B 43/50; H10W 20/20

See application file for complete search history.

(56) References Cited

U.S. PATENT DOCUMENTS

| | | | |
|---|---|---|---|
| 2019/0287990 A1* | 9/2019 | Sugisaki | H10B 43/35 |
| 2020/0303398 A1* | 9/2020 | Otsu | H10B 43/27 |
| 2022/0005824 A1* | 1/2022 | Tanaka | H10B 41/10 |

FOREIGN PATENT DOCUMENTS

| | | |
|---|---|---|
| JP | H09312332 A * | 12/1997 |
| JP | 2018-026518 A | 2/2018 |
| JP | 2019-161094 A | 9/2019 |

* cited by examiner

*Primary Examiner* — Dale E Page
*Assistant Examiner* — Cristian A Tivarus
(74) *Attorney, Agent, or Firm* — Oblon, McClelland, Maier & Neustadt, L.L.P.

(57) ABSTRACT

Contact plugs extend along a first axis. Each contact plug includes a second conductor and a first insulator. A first insulator is between the first conductors and the second conductor. A lower face of each contact plug is in contact with an upper face of a unique one of the first conductors. A first one and second one of the contact plugs are adjacent along a second axis that crosses the first axis. A third one of the contact plugs is between the first and second contact plugs on the second axis, and is at a different position from positions of the first and second contact plugs on a third axis orthogonal to the first and second axes.

5 Claims, 30 Drawing Sheets

MEMORY DEVICE

CROSS-REFERENCE TO RELATED APPLICATIONS

This application is based upon and claims the benefit of priority from Japanese Patent Application No. 2022-048579, filed Mar. 24, 2022, the entire contents of which are incorporated herein by reference.

FIELD

Embodiments described herein relate generally to a memory device.

BACKGROUND

A memory device in which memory cells are three-dimensionally disposed is known. It is requested that the memory device has a smaller area.

DETAILED DESCRIPTION

Figure 1:
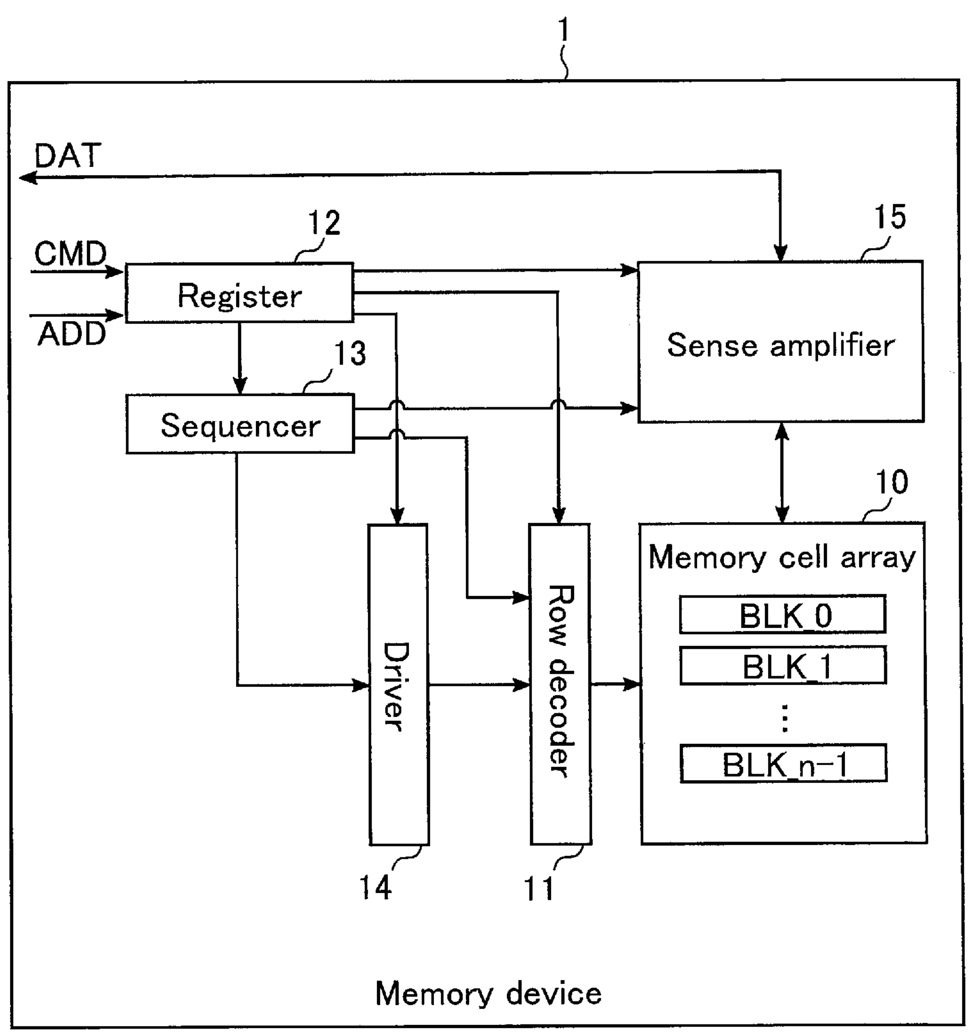
FIG. 1 illustrates examples of components of a memory device according to a first embodiment and coupling among the components.

In general, according to one embodiment, a memory device includes a plurality of first conductors, a memory pillar, and a plurality of contact plugs.

The first conductors are arranged along a first axis at intervals. The memory pillar extends along the first axis, faces the first conductors, and includes a semiconductor and a film that surrounds the semiconductor. The plurality of contact plugs extend along the first axis. Each of the contact plugs includes a second conductor and a first insulator that surrounds the second conductor. The first insulator is located between the first conductors and the second conductor. A lower face of each of the contact plugs is in contact with an upper face of a unique one of the first conductors. The contact plugs include a first contact plug, a second contact plug, and a third contact plug. The first contact plug and the second contact plug are disposed along a second axis to be adjacent to each other. The second axis crosses the first axis. The third contact plug is located between the first contact plug and the second contact plug on the second axis, and is disposed in a different position from positions of the first contact plug and the second contact plug on a third axis that is orthogonal to the first axis and the second axis.

In the description below, in an embodiment that follows a certain described embodiment, a difference from the described embodiment is principally described. The entirety of the description of a certain embodiment is also applicable to the description of another embodiment, unless excluded explicitly or obviously. Accordingly, in principle, the description of a certain embodiment does not include the same content as the content of the description of a preceding embodiment, unless necessary. With respect to a plurality of components having roughly the same function and configuration in a certain embodiment or over different embodiments, in some cases, an additional number or character is added to the end of a reference sign in order to distinguish the components from each other.

The drawings are schematic, and a relationship between thickness and a planar size, a ratio of the thicknesses of respective layers, or the like can be different from an actual one. The drawings can also include a portion that is different in a relationship or ratio in size between the drawings. In a plan view, in some cases, hatching is added in order to improve visibility of the view. Hatching added to the plan view is not necessarily related to a material and/or characteristics of a component to which hatching was added.

In the specification and the claims, a certain first element being “coupled” to another second element includes that the first element is directly, or always or temporality coupled to the second element with a conductive element interposed therebetween.

Embodiments are described below by using an xyz rectangular coordinate system. In some cases, a positive direction of a vertical axis of a drawing is referred to as an upper side, and a negative direction is referred to as a lower side. In some cases, a positive direction of a horizontal axis of a drawing is referred to as a right-hand side, and a negative direction is referred to as a left-hand side.

1. First Embodiment

1.1. Configuration (Structure)

1.1.1 Memory Device

FIG. 1 illustrates examples of components of a memory device according to a first embodiment and coupling among the components. A memory device 1 is a device that stores data by using a memory cell. The memory device 1 is controlled by an external memory controller. The memory device 1 operates based on, for example, a command CMD and address information ADD received from the memory controller. The memory device 1 receives data DAT to be written, and outputs data stored in the memory device 1. The memory device 1 is configured, for example, as a single semiconductor chip.

The memory device 1 includes components such as a memory cell array 10, a row decoder 11, a register 12, a sequencer 13, a driver 14, or a sense amplifier 15.

The memory cell array 10 is a set of memory cell transistors and components that are coupled to the memory cell transistors. The memory cell array 10 includes a plurality of memory blocks (blocks) BLK (BLK_0, BLK_1, . . . ). Each of the blocks BLK includes a plurality of memory cell transistors MT (not illustrated). In the memory cell array 10, interconnects such as word lines WL (not illustrated) or bit line BLs (not illustrated), and interconnects that are coupled to the memory cell transistors MT are also located.

The row decoder 11 is a circuit that is configured to select the block BLK. The row decoder 11 transfers voltages supplied from the driver 14, to a single block BLK selected based on a block address received from the register 12.

The register 12 is a circuit that holds a command CMD and address information ADD received by the memory device 1. The command CMD instructs the sequencer 13 to perform various operations including data read, data write, and data erase. The address information ADD designates a target of access in the memory cell array 10.

The sequencer 13 is a circuit that controls an operation of the entirety of the memory device 1. The sequencer 13 controls the row decoder 11, the driver 14, and the sense amplifier 15 based on the command CMD received from the register 12 to perform various operations including data read, data write, and data erase.

The driver 14 is a circuit that generates a plurality of voltages of different magnitudes, and applies various voltages required for an operation of the memory device 1 to some components. From among the generated voltages, voltages selected based on control performed by the sequencer 13 and the address information ADD are supplied to the row decoder 11.

The sense amplifier 15 is a circuit that outputs a signal based on data stored in the memory cell array 10. The sense amplifier 15 senses a state of the memory cell transistor MT, generates read data based on the sensed state, or transfers write data to the memory cell transistor MT.

1.1.2. Circuit Configuration of Memory Cell Array

Figure 2:
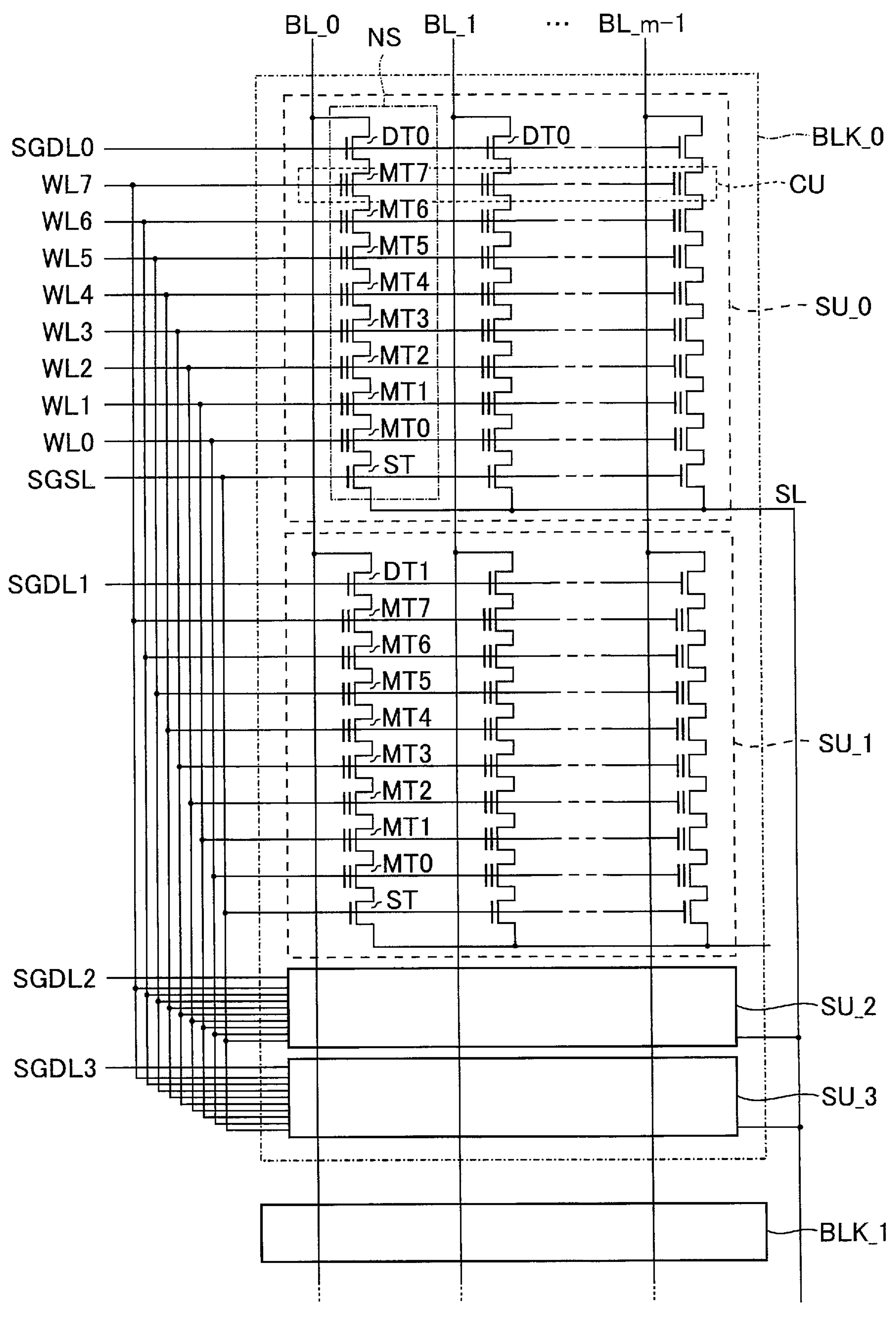
FIG. 2 illustrates components of a single block of the memory device according to the first embodiment, and coupling among the components.

FIG. 2 illustrates components of a single block BLK of the memory device according to the first embodiment, and coupling among the components. A plurality of blocks BLK, for example, all of the blocks BLK, includes the components and coupling that are illustrated in FIG. 2. A single block BLK includes a plurality of string units SU. FIG. 2 illustrates an example of four string units SU_0 to SU_3.

Each of m bit lines BL_0 to BL_m−1 is coupled to a single NAND string NS from each of the string units SU_0 to SU_3 in each of the blocks BLK. m is a positive integer.

Each of the NAND strings NS includes a single select gate transistor ST, a plurality of memory cell transistors MT, and a single select gate transistor DT (DT0, DT1, DT2, or DT3). FIG. 2 is based on an example of eight memory cell transistors MT0 to MT7. The memory cell transistor MT is an element that includes a control gate electrode and a charge storage film insulated from the periphery, and stores data based on a charge amount in the charge storage film in a non-volatile manner. The select gate transistor ST, the memory cell transistors MT, and the select gate transistor DT are coupled in series in this order between a source line SL and a single bit line BL.

A plurality of NAND strings NS respectively coupled to a plurality of different bit lines BL configure a single string unit SU. In each of the string units Su, the control gate electrodes of the memory cell transistors MT0 to MT7 are respectively coupled to word lines WL0 to WL7. A group of memory cell transistors MT that share the word line WL in a single string unit SU is referred to as a cell unit CU.

The select gate transistors DT0 to DT3 respectively belong to the string units SU_0 to SU_3. In FIG. 2, the select gate transistors DT2 and DT3 are not illustrated. A gate of the select gate transistor DT0 of each of the plurality of NAND strings NS of the string unit SU_0 is coupled to a select gate line SGDL0. Similarly, gates of the select gate transistor DT1, DT2, or DT3 of each of the plurality of NAND strings NS of each of the string units SU_1, SU_2, and SU_3 are coupled to select gate lines SGDL1, SGDL2, or SGDL3, respectively.

A gate of the select gate transistor ST is coupled to a select gate line SGSL.

1.1.3. Plane Layout of Memory Cell Array

Figure 3:
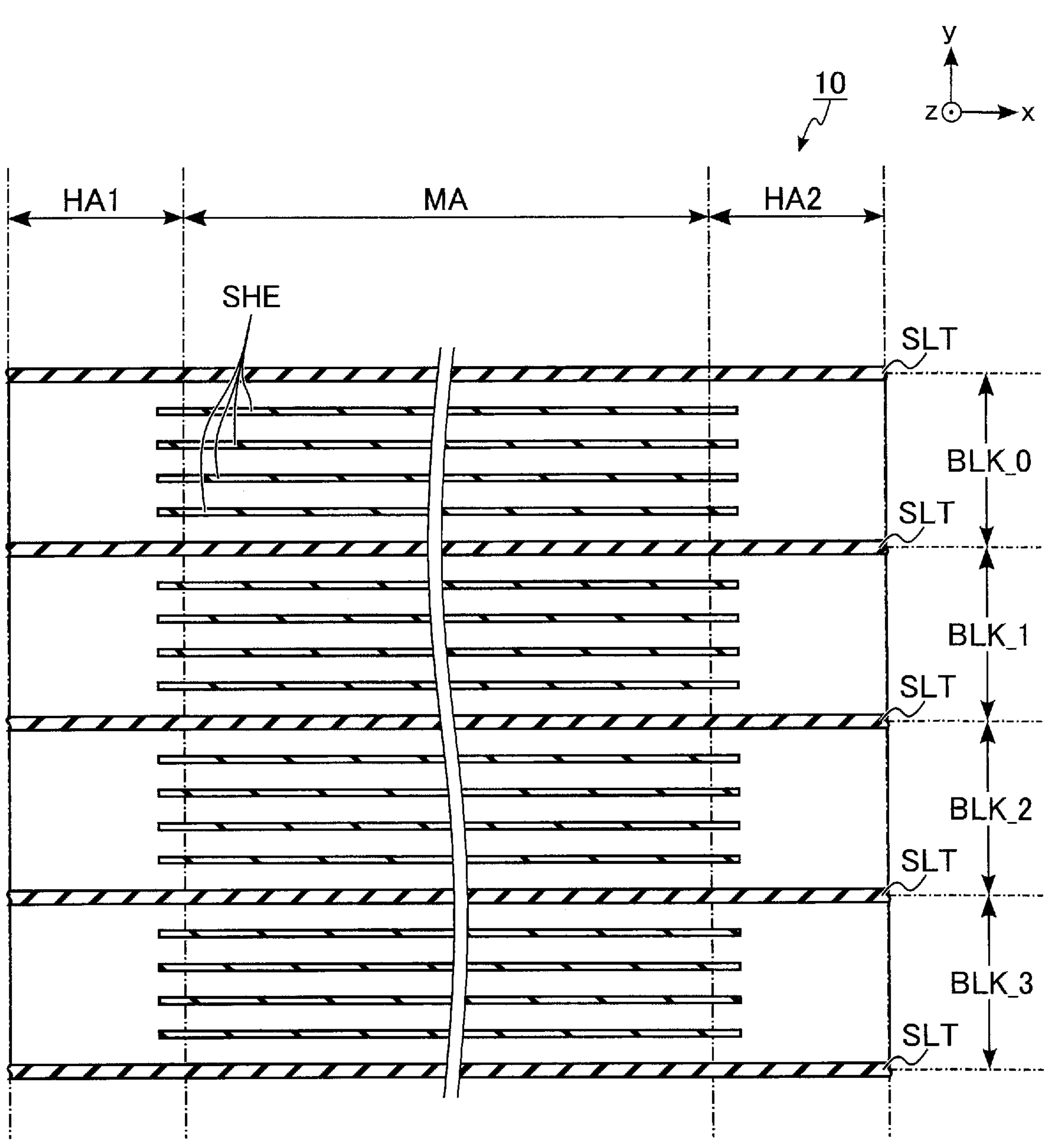
FIG. 3 illustrates an example of a plane layout of part of a memory cell array of the memory device according to the first embodiment.

FIG. 3 illustrates an example of a plane layout of part of a memory cell array of the memory device according to the first embodiment. FIG. 3 illustrates an area where four blocks BLK_0 to BLK 3 are formed, along an xy-plane. The structure illustrated in FIG. 3 is repeatedly provided along a y-axis.

As illustrated in FIG. 3, the memory cell array 10 includes a memory area MA and hookup areas HA1 and HA2. The hookup area HA1, the memory area MA, and the hookup area HA2 are arranged along an x-axis in this order. The memory cell array 10 is provided with a plurality of members SLT and SHE.

The memory area MA is an area including the plurality of NAND strings NS. A hookup area HA is an area that is provided with contact plugs that are coupled to a stacked structure in which the memory cell transistors are formed.

The plurality of members SLT extend along the x-axis, and are arranged along the y-axis. Each of the members SLT is located at a boundary between adjacent blocks BLK. The members SLT cross the memory area MA and the hookup areas HA1 and HA2. Each of the members SLT has, for example, a structure in which an insulator and/or a contact having a plate shape are embedded. Each of the members SLT divides stacked structures that are adjacent with the member SLT interposed therebetween.

Figure 4:
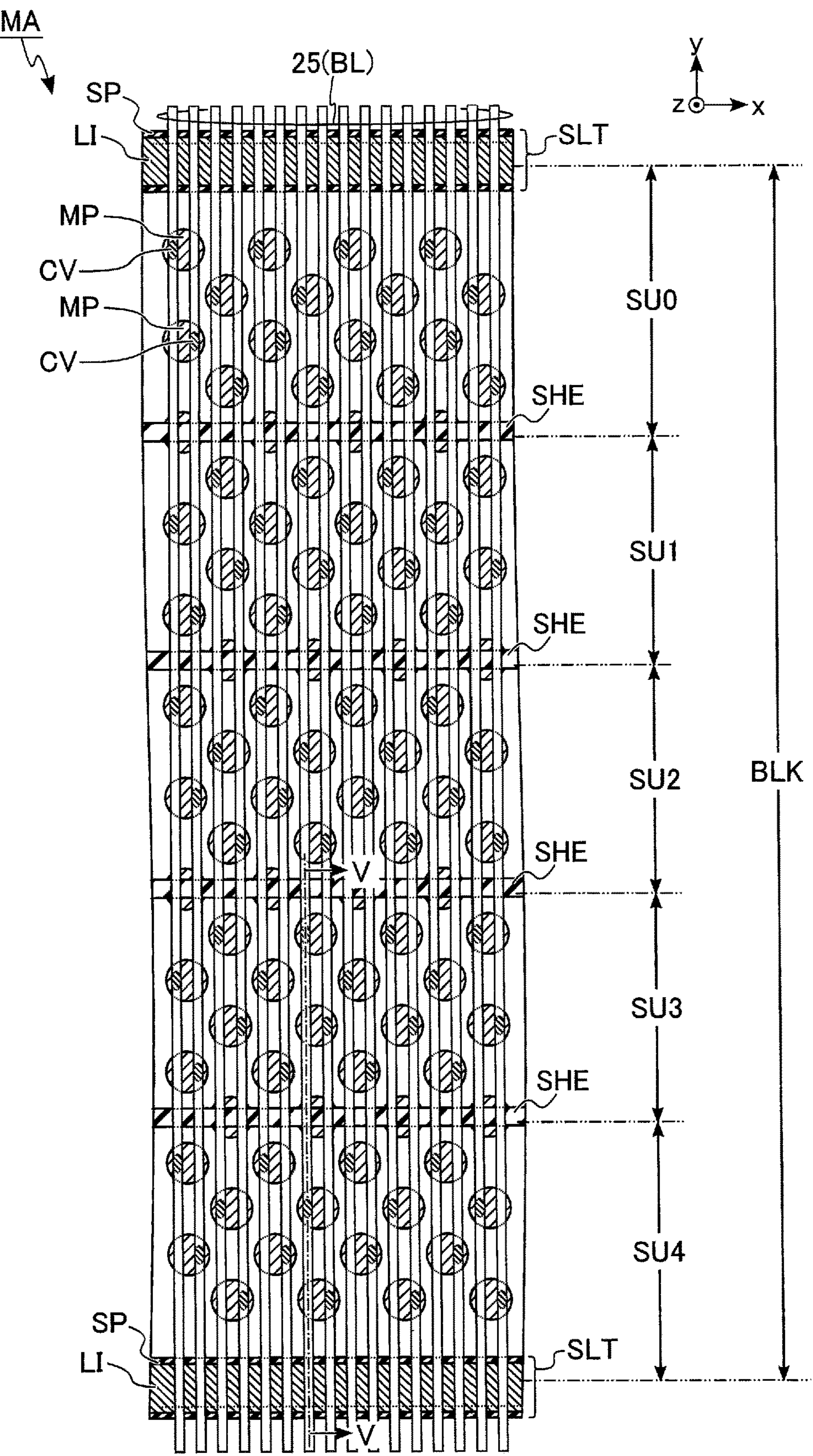
FIG. 4 illustrates an example of a plane layout of part of a memory area of the memory device according to the first embodiment.

The plurality of members SHE extend along the x-axis, and are arranged along the y-axis. A plurality of members SHE are located between every two adjacent members SLT. FIG. 4 illustrates an example of four members SHE. Each of the members SHE crosses the memory area MA along the x-axis. Both ends of each of the members SHE are respectively located in the hookup areas HAL and HA2. Each of the members SHE includes, for example, an insulator. Each of the members SHE divides select gate lines SGDL that are adjacent with the member SHE interposed therebetween. Each area sectioned by the members SLT and SHE is an area where a single string unit SU is formed.

1.1.4. Plane Layout of Memory Area

FIG. 4 illustrates an example of a plane layout of part of a memory area of the memory device according to the first embodiment. FIG. 4 illustrates a single block BLK, that is, an area including the string units SU0 to SU4, and two members SLT that sandwich this block. As illustrated in FIG. 4, the memory cell array 10 includes a plurality of memory pillars MP, a plurality of contact plugs CV, and a plurality of conductors 25 in the memory area MA. Each of the members SLT includes a contact LI and a spacer SP.

The memory pillar MP has a structure in which the memory cell transistors MT are formed inside. The memory pillar MP includes one or more of a semiconductor, a conductor, and an insulator. The memory pillar MP functions as a single NAND string NS. A plurality of memory pillars MP are distributed in a staggered array in an area between two members SLT. Stated another way, the plurality of memory pillars MP are disposed in a plurality of columns extending along the y-axis, and each of the columns of the memory pillars MP are disposed in a zigzag manner along the y-axis. In other words, each of the columns includes two sub columns. A coordinate on the y-axis of each of the memory pillars MP in one sub column is located at a coordinate on the y-axis between two adjacent memory pillars MP in another sub column. Each of the columns includes, for example, 24 memory pillars MP.

The members SHE respectively overlap, for example, 5th, 10th, 15th, and 20th memory pillars MP counted from an upper side of the FIG. 4.

Each of the conductors 25 functions as a single bit line BL. The conductors 25 extend along the y-axis, and are arranged along the x-axis. Each of the conductors 25 is disposed to overlap at least a single memory pillar MP in each of the string units SU. FIG. 4 illustrates an example where two conductors 25 are disposed to overlap a single memory pillar MP. Each of the memory pillars MP is electrically coupled to a single conductor 25 of a plurality of conductors 25 that overlaps this memory pillar MP by using the contact plug CV.

The contact LI includes a conductor. The contact LI extends along an xz-plane, and has a plate shape. The spacer SP is an insulator, is located on a side face of the contact LI, and covers, for example, the side face of the contact LI.

1.1.5. Cross-Sectional Structure of Memory Area

Figure 5:
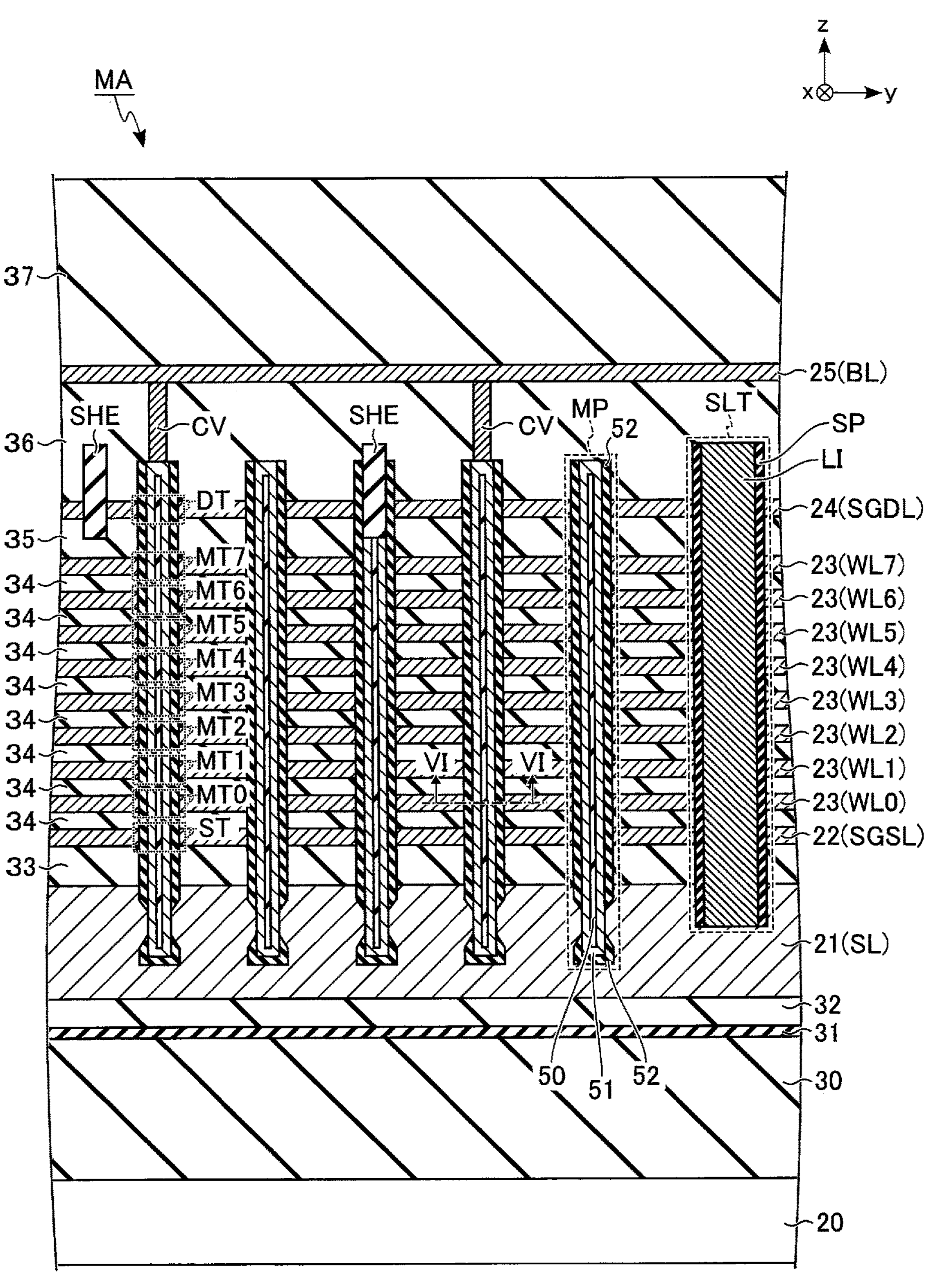
FIG. 5 illustrates a structure of a cross section of part of the memory area of the memory device according to the first embodiment.

FIG. 5 illustrates a structure of a cross section of part of the memory area of the memory device according to the first embodiment. Specifically, FIG. 5 illustrates a cross section along line V-V of FIG. 4.

As illustrated in FIG. 5, the memory cell array 10 further includes a substrate 20, conductors 21 and 22, a plurality of conductors 23, conductors 24 and 25, and insulators 30 to 37. FIG. 5 illustrates an example of eight conductors 23. The insulators 30 to 37 include, for example, silicon oxide, excluding the insulator 31.

The substrate 20 is, for example, a substrate of a p-type semiconductor. On an upper face of the substrate 20, the insulator 30 is located. In the semiconductor substrate 20 and the insulator 30, a not-illustrated circuit is formed. The circuit is, for example, the row decoder 11, the driver 14, and/or the sense amplifier 15, and includes a not-illustrated transistor.

The insulator 31 is located on an upper face of the insulator 30. The insulator 31 prevents, for example, hydrogen from entering a transistor included in the substrate 20 and the insulator 30, from a structure above the insulator 31. The insulator 31 includes, for example, silicon nitride.

The insulator 32 is located on an upper face of the insulator 31.

The conductor 21 is located on an upper face of the insulator 32. The conductor 21 extends along an xy-plane, and has a plate shape. The conductor 21 functions as at least part of the source line SL. The conductor 21 includes, for example, silicon doped with phosphorus.

The insulator 33 is located on an upper face of the conductor 21.

The conductor 22 is located on an upper face of the insulator 33. The conductor 22 extends along the xy-plane, and has a plate shape. The conductor 22 functions as at least part of the select gate line SGSL. The conductor 22 includes, for example, tungsten.

The plurality of insulators 34 and the plurality of conductors 23 are located alternately one by one along a z-axis on an upper face of the conductor 22. Accordingly, the conductors 23 are arranged along the z-axis to be separated from each other or be spaced apart from each other. The insulator 34 and the conductor 23 extend along the xy-plane, and have a plate shape. The plurality of conductors 23 respectively functions as the word lines WL0 to WL7 in order from a side of the substrate 20. The conductor 23 includes, for example, tungsten.

The insulator 35 is located on an upper face of an uppermost conductor 23.

The conductor 24 is located on an upper face of the insulator 35. The conductor 24 extends along the xy-plane, and has a plate shape. The conductor 24 functions as at least part of the select gate line SGDL. The conductor 24 includes, for example, tungsten.

The insulator 36 is located on an upper face of the conductor 24.

The conductor 25 is located on an upper face of the insulator 36. The conductor 25 has a linear shape, and extends along the y-axis. The conductor 25 functions as at least part of a single bit line BL. The conductor 25 is also provided on a yz-plane that is different from the yz-plane illustrated in FIG. 5, and therefore the conductors 25 are arranged along the x-axis to be spaced apart from each other. The conductor 25 includes, for example, copper.

The insulator 37 is located on an upper face of the conductor 25.

Each memory pillar MP extends along the z-axis, and has a pillar shape. The memory pillar MP is located in a stacked structure including the insulators 33 to 35 and the conductors 22 to 24, and penetrates or passes through the insulators 33 to 35 and the conductors 22 to 24. An upper face of the memory pillar MP is located above the conductor 24. A lower face of the memory pillar MP is located in the conductor 21. A portion where the memory pillar MP and the conductor 22 are in contact with each other functions as the select gate transistor ST. A portion where the memory pillar MP and a single conductor 23 are in contact with each other functions as a single memory cell transistor MT. A portion where the memory pillar MP and the conductor 24 are in contact with each other functions as the select gate transistor DT.

The memory pillar MP includes, for example, a core 50, a semiconductor 51, and a layer stack 52. The core 50 includes an insulator, and includes, for example, silicon oxide. The core 50 extends along the z-axis, and has a pillar shape. The semiconductor 51 includes, for example, silicon. The semiconductor 51 covers a surface of the core 50. The layer stack 52 covers a side face and a lower face of the semiconductor 51. The layer stack 52 is opened in the conductor 21, and the conductor 21 is partially located in an opening. In the opening, the conductor 21 is in contact with the semiconductor 51.

As described above, a single memory pillar MP and a single conductor 25 are coupled by the contact plug CV.

The member SLT divides the conductors 22 to 24. An upper face of the member SLT is located above the upper face of the memory pillar MP. A lower face of the contact LI is in contact with the conductor 21. The spacer SP is located between the contact LI and the conductors 22 to 24, and insulates the contact LI from the conductors 22 to 24. The contact LI functions as part of the source line SL.

The member SHE divides the conductor 24. A lower face of the member SHE is located in the insulator 35. The member SHE includes, for example, an insulator such as silicon oxide.

Figure 6:
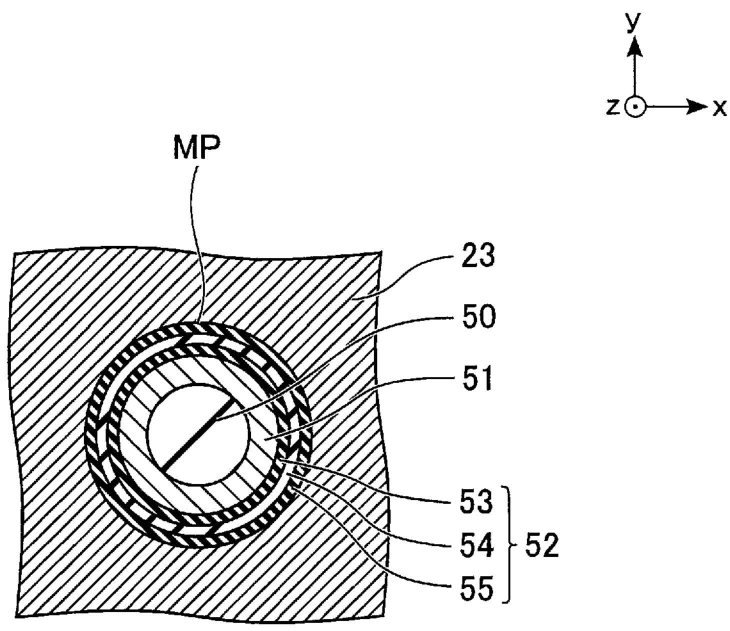
FIG. 6 illustrates an example of a structure of a cross section of a memory pillar of the memory device according to the first embodiment.

FIG. 6 illustrates an example of a structure of a cross section of a memory pillar of the memory device according to the first embodiment. Specifically, FIG. 6 illustrates a cross section along line VI-VI of FIG. 5. As illustrated in FIG. 6, the layer stack 52 includes, for example, a tunnel insulator 53, a charge storage film 54, and a block insulator 55.

The tunnel insulator 53 surrounds the side face of the semiconductor 51. The charge storage film 54 surrounds a side face of the tunnel insulator 53. The block insulator 55 surrounds a side face of the charge storage film 54. The conductor 23 surrounds a side face of the block insulator 55.

The semiconductor 51 functions as a channel (a current path) of the memory cell transistors MT0 to MT7 and the select gate transistors DT and ST. Each of the tunnel insulator 53 and the block insulator 55 includes, for example, silicon oxide. The charge storage film 54 stores charges. The charge storage film 54 includes, for example, silicon nitride.

1.1.6. Structure of Hookup Area

Figure 7:
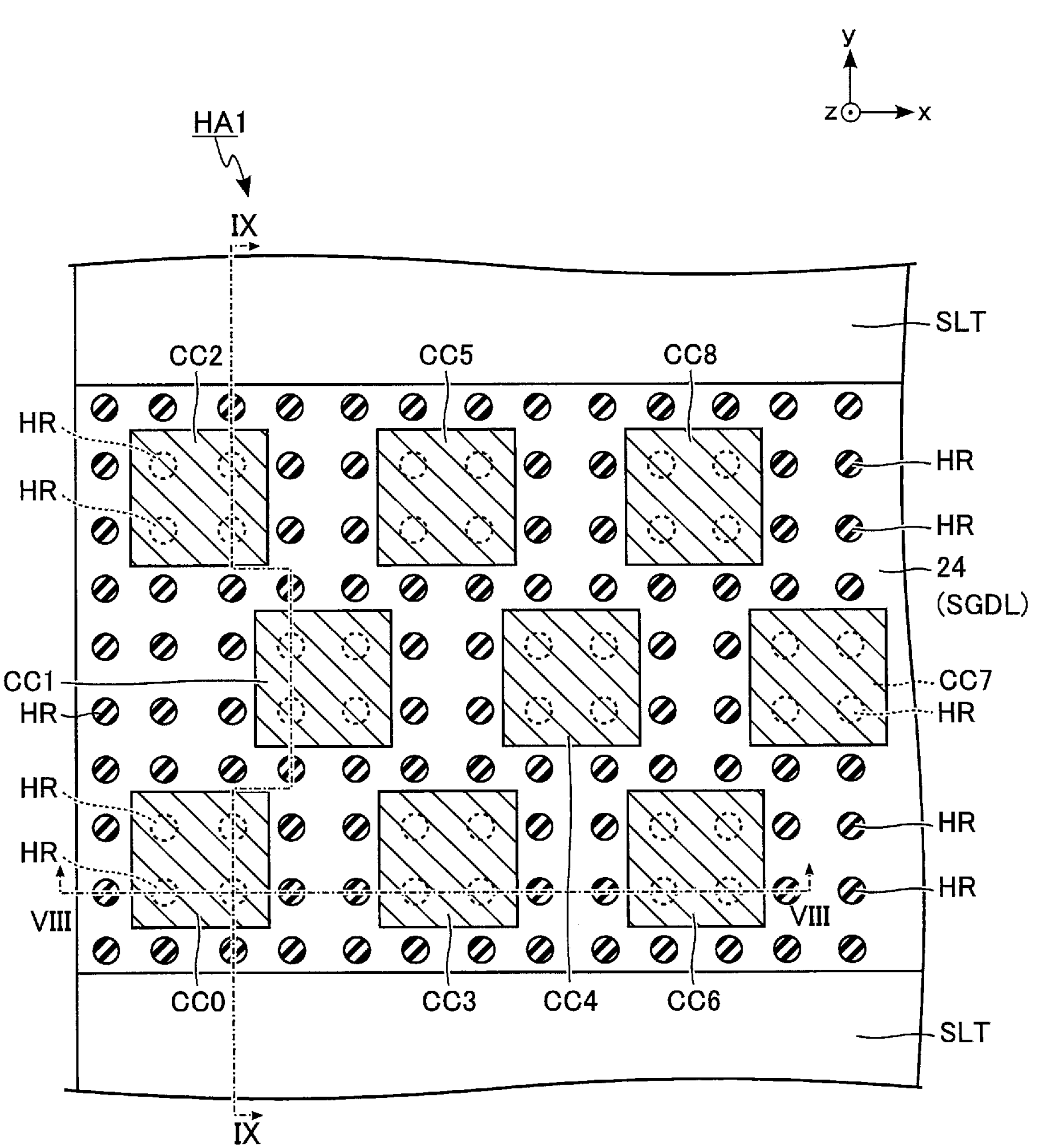
FIG. 7 illustrates an example of a plane layout of part of a hookup area of the memory device according to the first embodiment.

FIG. 7 illustrates an example of a plane layout of part of a hookup area of the memory device according to the first embodiment. FIG. 7 illustrates part of an area between the two members SLT along the xy-plane. FIG. 7 illustrates a layout in a case where a layer including the conductor 24 is viewed from the above on the z-axis.

As illustrated in FIG. 7, the hookup area HA1 includes a plurality of support pillars HR and a plurality of contact plugs CC.

The support pillars HR are distributed over the entirety of the hookup area HA1. The support pillar HR includes, for example, an insulator such as silicon oxide. The support pillar HR has a pillar shape, and extends along the z-axis. The support pillar HR extends from a layer of the insulator 36 to a layer of the conductor 22, as described later with reference to FIG. 8. Some of the support pillars HR at least partially overlap the contact plug CC. In the support pillar HR that overlaps the contact plug CC, an upper face of a portion that overlaps the contact plug CC is in contact with the contact plug CC, and the portion is not located in the insulator 36. The support pillar HR is not located at a center of one or more contact plugs CC, for example, each of the contact plugs CC, and is located in an area that deviates from the center.

The contact plug CC has a shape of, for example, a quadrangle. The contact plugs CC configure a plurality of rows along the x-axis. FIG. 7 illustrates, as an example, three rows of contact plugs CC. A row of contact plugs CC is referred to as a contact plug set in some cases. The contact plugs CC are distributed in a staggered array, and stated another way, two adjacent rows of contact plugs CC are located to be shifted from each other. Details are described below. Two contact plugs CC that respectively belong to two adjacent rows are located on different coordinates on the x-axis. For example, a coordinate on the x-axis of each of the contact plugs CC in one of two rows of contact plugs CC is the same as a coordinate on the x-axis of an area between two adjacent contact plugs CC in the other of the two rows of contact plugs CC. For example, a coordinate on the x-axis of each of the contact plugs CC in one row is substantially the same as a coordinate of a center on the x-axis of an area between two adjacent contact plugs CC in another row. On the other hand, coordinates on the x-axis of contact plugs CC in two rows that sandwich another row are substantially the same as each other. Stated another way, a coordinate on the x-axis of each of the contact plugs CC in one of two rows that sandwich another row is substantially the same as a coordinate on the x-axis of each of the contact plugs CC in the other of the two rows. In the specification and the claims, "substantially the same" intends "the same", but means that an error generated due to the limits of a manufacturing technology and/or a measurement technology is allowed.

In other words, two rows include contact plugs CC that are disposed in a zigzag manner along the x-axis. Disposition of contact plugs CC that is described by using a row is applicable to description using a column. Description relating to a column corresponds to description in which the "row" in the description above is replaced with a "column" and the "x-axis" is replaced with the "y-axis".

Lower faces of the respective contact plugs CC are in contact with upper faces of different conductors 23. A specific example is described below.

Contact plugs CC in a lowermost row are denoted by CC0, CC3, and CC6 in order from a left-hand side to a right-hand side. A lower face of the contact plug CC0 is in contact with an upper face of the conductor 23 that functions as the word line WL0. A lower face of the contact plug CC3 is in contact with an upper face of the conductor 23 that functions as the word line WL3. A lower face of the contact plug CC6 is in contact with an upper face of the conductor 23 that functions as the word line WL6.

Contact plugs CC in a second row from the bottom are denoted by CC1, CC4, and CC7 in order from the left-hand side to the right-hand side. A lower face of the contact plug CC1 is in contact with an upper face of the conductor 23 that functions as the word line WL1. A lower face of the contact plug CC4 is in contact with an upper face of the conductor 23 that functions as the word line WL4. A lower face of the contact plug CC7 is in contact with an upper face of the conductor 23 that functions as the word line WL7.

Contact plugs CC in an uppermost row are denoted by CC2, CC5, and CC8 in order from the left-hand side to the right-hand side. A lower face of the contact plug CC2 is in contact with an upper face of the conductor 23 that functions as the word line WL2. A lower face of the contact plug CC5 is in contact with an upper face of the conductor 23 that functions as the word line WL5. A lower face of the contact plug CC8 is in contact with an upper face of a conductor 23 that functions as a word line WL8.

As described with reference to FIG. 5, conductors 23 that function as different word lines WL are located at different heights or in different layers. Accordingly, a contact plug CC includes a lower face in a position based on a position of a conductor 23 that this contact plug CC is in contact with.

As described above with reference to FIG. 7, in a support pillar HR that at least partially overlaps a contact plug CC, an upper face of a portion that overlaps the contact plug CC is in contact with a lower face of this contact plug CC. Accordingly, a support pillar HR includes an upper face based on a position of a contact plug CC that this support pillar HR partially overlaps.

Figure 8:
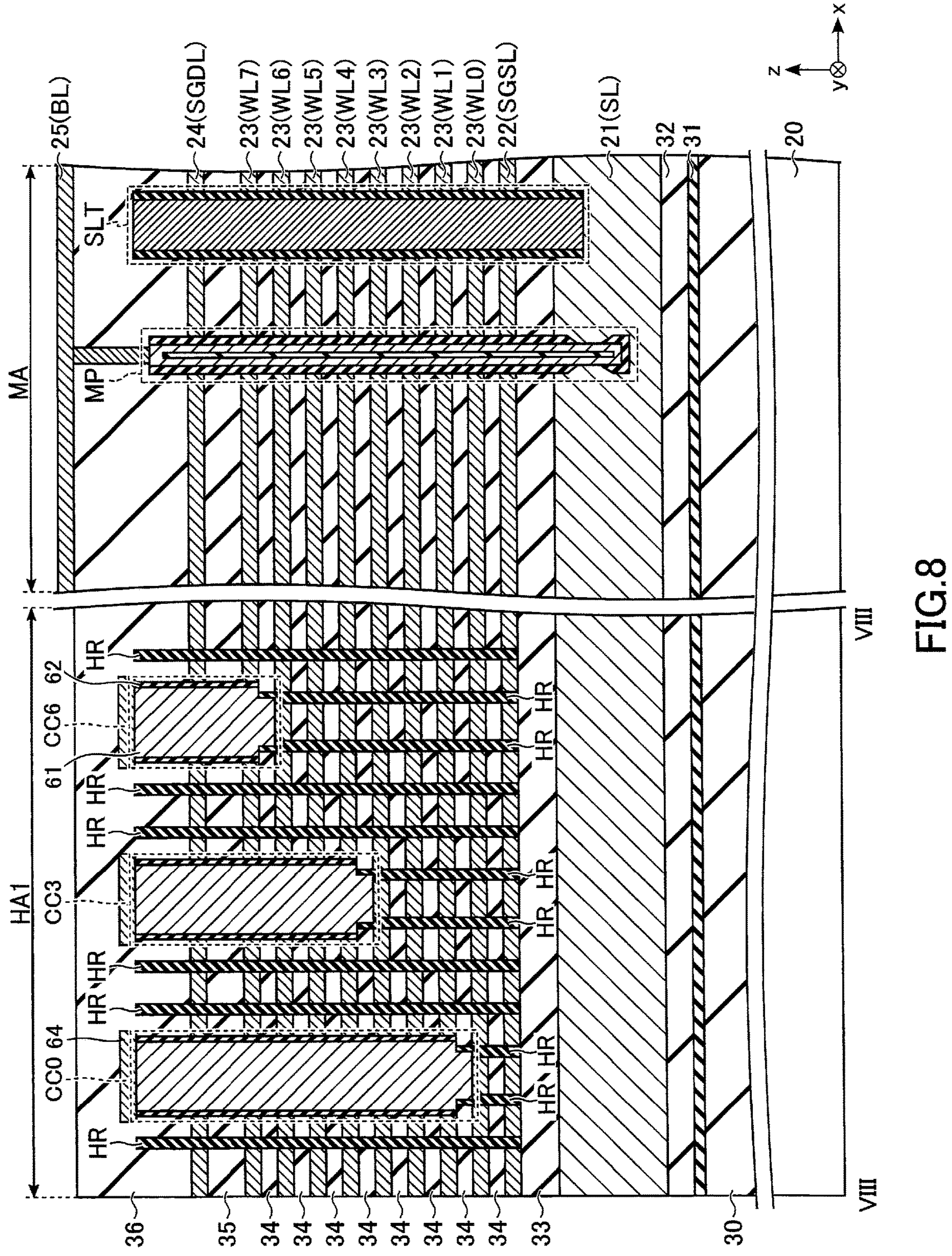
FIGS. 8 and 9 each illustrate structures of cross sections of parts of the memory area and the hookup area of the memory device according to the first embodiment.
Figure 9:
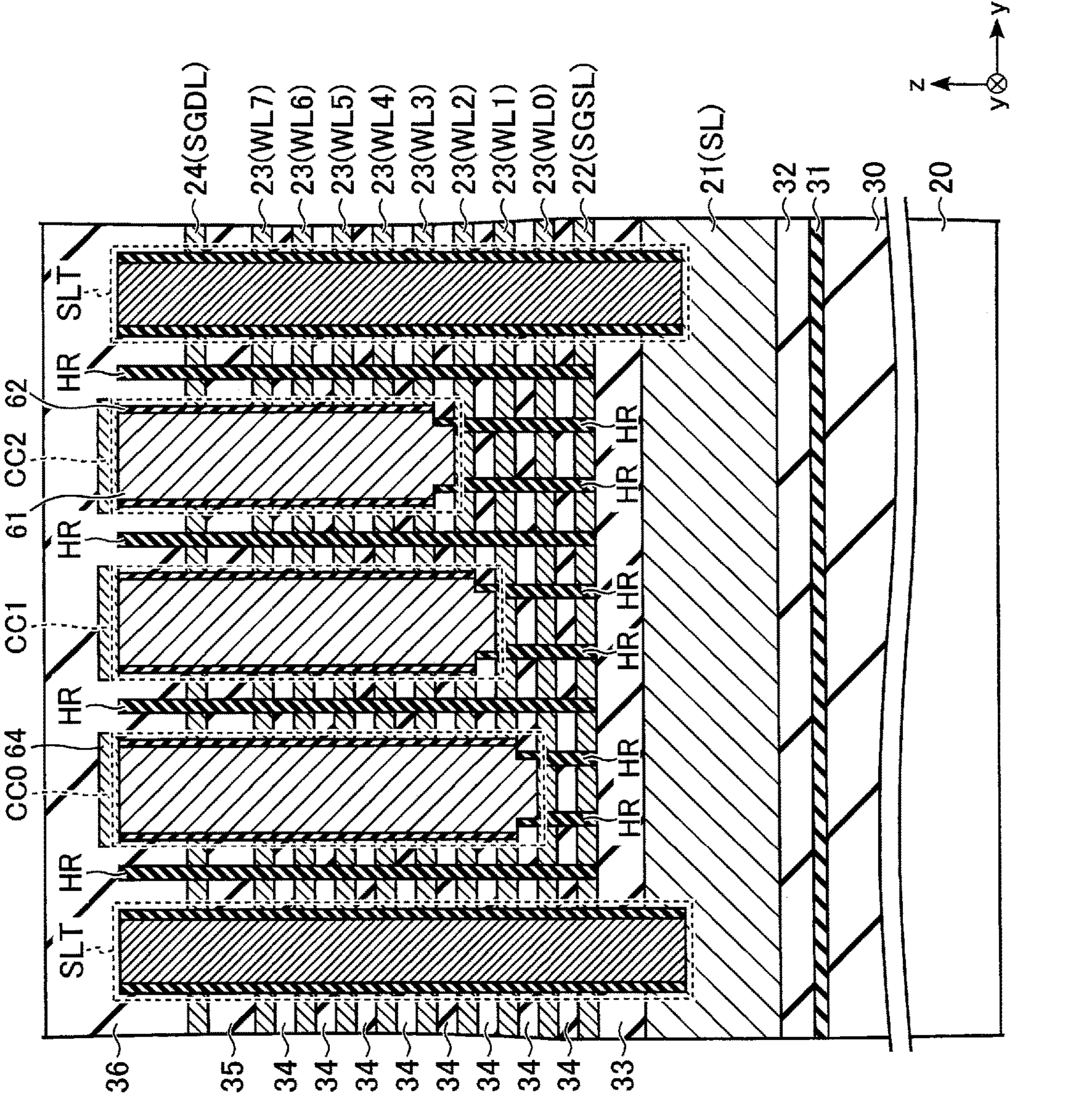

FIGS. 8 and 9 illustrate structures of cross sections of parts of the memory area and the hookup area of the memory device according to the first embodiment.

Specifically, FIG. 8 illustrates a cross section of the hookup area HA1 along line VIII-VIII of FIG. 7, and also illustrates part of the memory area MA illustrated in FIG. 5. FIG. 9 illustrates a cross section along line IX-IX of FIG. 7.

As illustrated in FIGS. 8 and 9, each of the contact plugs CC penetrates the conductor 24 and the insulator 35. Some of the contact plugs CC further penetrate one or more conductors 23 and one or more insulators 34. Each of the contact plugs CC includes a conductor 61 and a spacer 62.

The conductor 61 includes, in a lower face, a protrusion that protrudes downward on the z-axis. A lower face of the protrusion is in contact with an upper face of a single conductor 23. The lower face of the protrusion can also be in contact with an upper face of one or more support pillars HR. A side face of the contact plug CC is covered with the spacer 62. The spacer 62 is, for example, silicon oxide. The side face of the spacer 62 is in contact with the conductor 24 and the insulator 35. Spacers 62 of some of the contact plugs CC are further in contact with one or more conductors 23 and one or more insulators 34. The spacer 62 insulates the conductor 61 from conductors 23 other than a conductor 23 that a lower face of the conductor 61 is in contact with.

As described with reference to FIG. 7, lower faces of different contact plugs CC are in contact with different conductors 23. A lower face of the contact plug CC0 is in contact with an upper face of the conductor 23 that functions as the word line WL0. A lower face of the contact plug CC1 is in contact with an upper face of the conductor 23 that functions as the word line WL1. A lower face of the contact plug CC2 is in contact with an upper face of the conductor 23 that functions as the word line WL2. A lower face of the contact plug CC3 is in contact with an upper face of the conductor 23 that functions as the word line WL3. A lower face of the contact plug CC6 is in contact with an upper face of the conductor 23 that functions as the word line WL6.

A conductor 60 is provided on the upper face of the contact plug CC.

With reference to FIGS. 7 to 9, the hookup area HA1 has been described, and in particular, the contact plugs CC0 to CC8 have been described. Other contact plugs CC and the hookup area HA2 are similar to the hookup area HA1 and the contact plugs CC0 to CC8 that have been described with reference to FIGS. 7 to 9. Stated another way, the hookup area HA2 has a plane layout in which a plane layout of the hookup area HA1 was inverted along the y-axis. A lower face of a contact plug CC other than the contact plugs CC0 to CC8 is in contact with a conductor 23 that is different from a conductor 23 that another contact plug CC is in contact with.

1.2. Manufacturing Method

FIGS. 10 to 27 each illustrate an example of a structure of a cross section in a single step of a process of manufacturing the memory device according to the first embodiment. FIGS. 10 to 12, FIGS. 14 to 16, FIG. 18, FIG. 20, and FIGS. 22 to 27 sequentially illustrate a structure during the manufacturing process. FIGS. 10 to 12, FIGS. 14 to 16, FIG. 18, FIG. 20, and FIGS. 22 to 27 illustrate a cross section of an area that is the same as an area of the cross section illustrated in FIG. 8. FIG. 13, FIG. 17, FIG. 19, and FIG. 21 respectively illustrate steps that are the same as the steps of FIG. 12, FIG. 16, FIG. 18, and FIG. 20. FIG. 12, FIG. 16, FIG. 18, and FIG. 20 illustrate a cross section of an area that is the same as an area of the cross section illustrated in FIG. 9.

Figure 10:
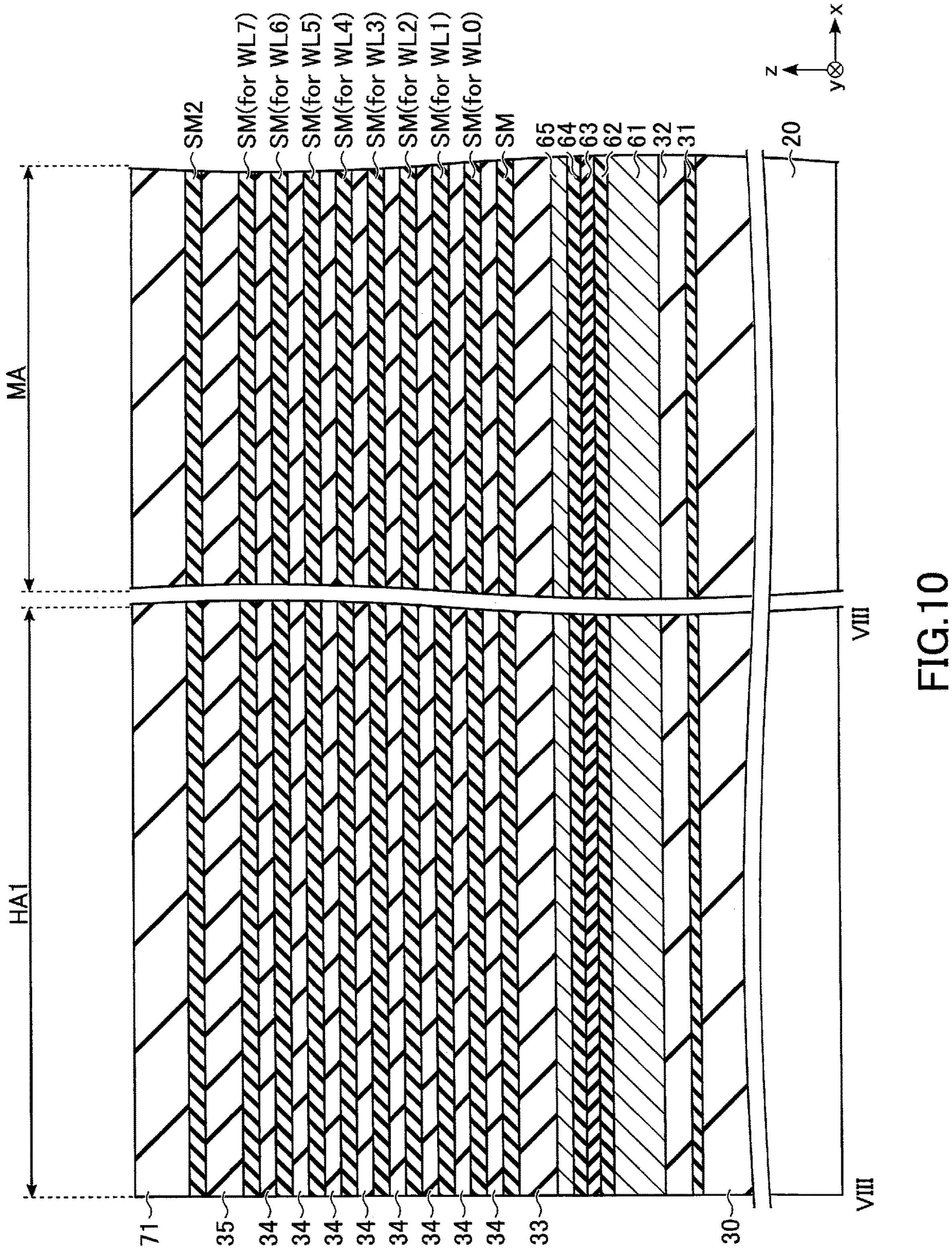
FIGS. 10 to 27 each illustrate examples of a structure of a cross section during a single step of a process of manufacturing the memory device according to the first embodiment.

As illustrated in FIG. 10, after a circuit (not illustrated) is formed on the substrate 20, the insulators 31 and 32, the conductor 61, the insulators 62, 63, and 64, and the conductor 65 are deposited in this order on an upper face of the substrate 20. A group of the conductor 61, the insulators 62, 63, and 64, and the conductor 65 occupies an area where the conductor 21 is to be formed.

On an upper face of the conductor 65, the insulator 33 is formed.

On an upper face of the insulator 33, a plurality of insulators SM and a plurality of insulators 34 are deposited alternately one by one. A lowermost insulator SM occupies an area where the conductor 22 is to be formed. Remaining insulators SM are located in areas where the conductor 23 is to be formed. The insulator SM includes, for example, silicon nitride.

On an upper face of an uppermost insulator SM, the insulator 35, an insulator SM2, and an insulator 71 are deposited in this order. The insulator SM2 is located in an area where the conductor 24 is to be formed. The insulator 71 configures part of the insulator 36. The insulator SM2 includes, for example, silicon nitride.

Figure 11:
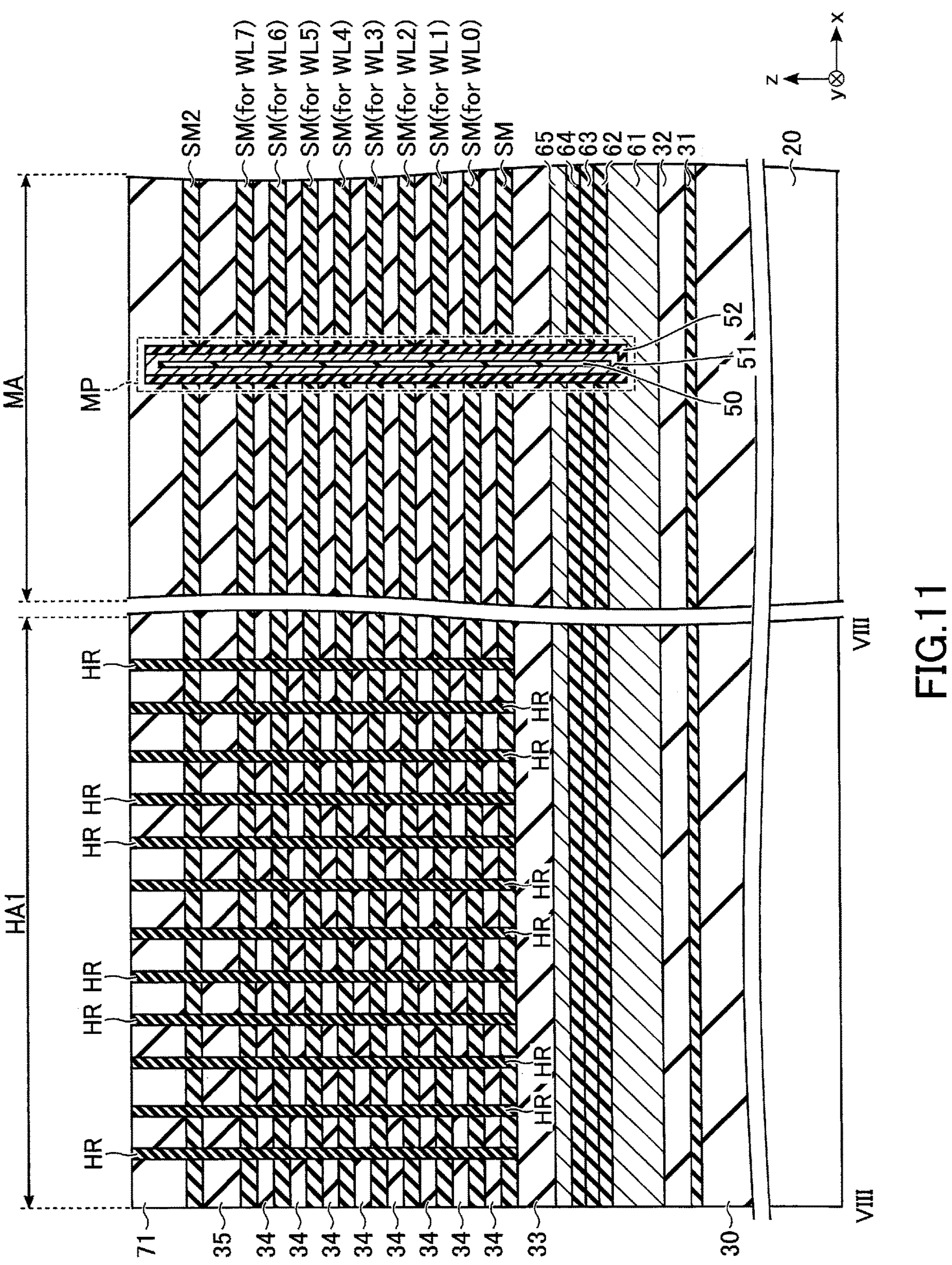

As illustrated in FIG. 11, the memory pillar MP is formed. However, the layer stack 52 of the memory pillar MP does not include an opening in this stage. Details are described below. Specifically, photolithography and anisotropic etching are performed, and therefore a memory hole is formed. The memory hole is located in an area where the memory pillar MP is to be formed. The memory hole penetrates the insulators 71, SM2, 35, SM, 34, and 33, the conductor 65, and the insulators 64, 63, and 62. A bottom of the memory hole is located in the conductor 61. On a surface of the memory hole, the layer stack 52, that is, the tunnel insulator 53, the charge storage film 54, and the block insulator 55, is formed. On a surface of the layer stack 52, the semiconductor 51 is formed. On a surface of the semiconductor 51, the core 50 is formed, and therefore a center of the memory hole is filled with the core 50. Then, an upper part of the core 50 is removed, and the semiconductor 51 is formed in the removed portion. By doing this, the memory pillar MP is formed, and then an insulator is formed on the upper face of the memory pillar MP. In FIG. 11, this insulator is illustrated as part of the insulator 71.

The support pillars HR are formed. Each of the support pillars HR penetrates the insulators 71, SM2, 35, SM, and 34. Each of the support pillars HR extends from an upper face of the insulator 71 to the upper face of the insulator 33.

Figure 12:
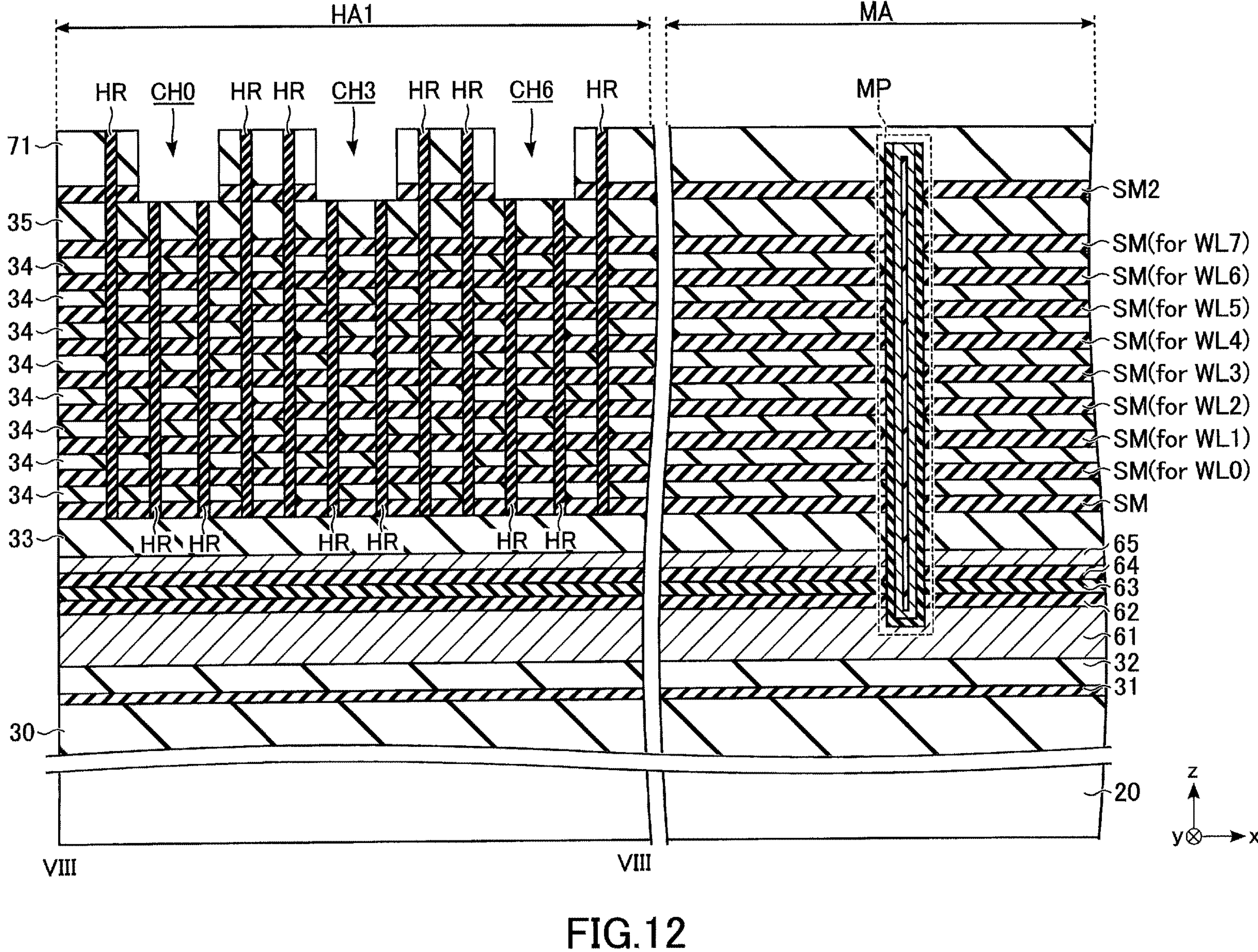
Figure 13:
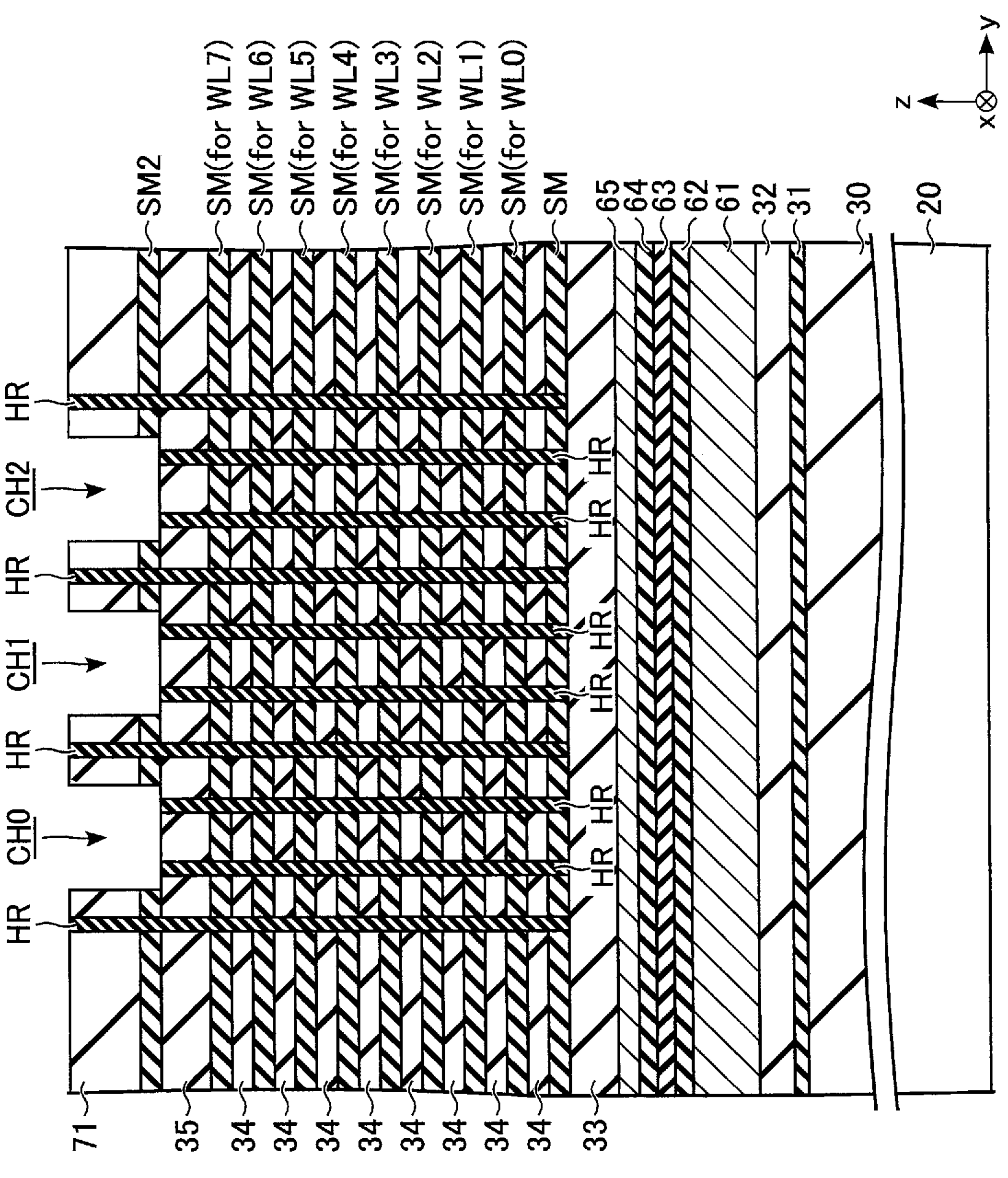

In the steps of FIGS. 12 and 13 and steps that follow, contact holes CH for the contact plugs CC are formed. As described with reference to FIGS. 7 to 9, the contact plugs CC include bottoms that are located at different heights based on positions of conductors 23 that the contact plugs CC are respectively in contact with. Accordingly, the contact holes CH also include bottoms that are located at different depths in a stage before being filled with the conductor 61. For this purpose, in a contact hole CH that includes a bottom in a deeper position, the bottom is further etched in a step that follows the step illustrated in FIG. 14. In steps beginning at steps of FIGS. 12 and 13, etching is performed in such a way that each of the contact holes CH has a peculiar intended (target) depth. A contact hole CH that is to have a greater intended depth is repeatedly etched. On the other hand, a contact hole CH that has reached an intended depth is filled with the filling member NG described later, while another contact hole CH is further etched.

As illustrated in FIGS. 12 and 13, part of the contact hole CHs are formed. A contact hole CH is an area where a contact plug CC is formed. Details of formation are described below.

Photolithography is performed, and therefore a mask is formed on the upper face of the insulator 71. The mask includes an opening above areas where the contact plugs CC0 to CC8 are to be formed. Anisotropic etching is performed by using the mask, and therefore contact holes CH0 to CH8 are formed. The contact holes CH0 to CH8 penetrate the insulators 71 and SM2, and reach the upper face of the insulator 35.

Figure 14:
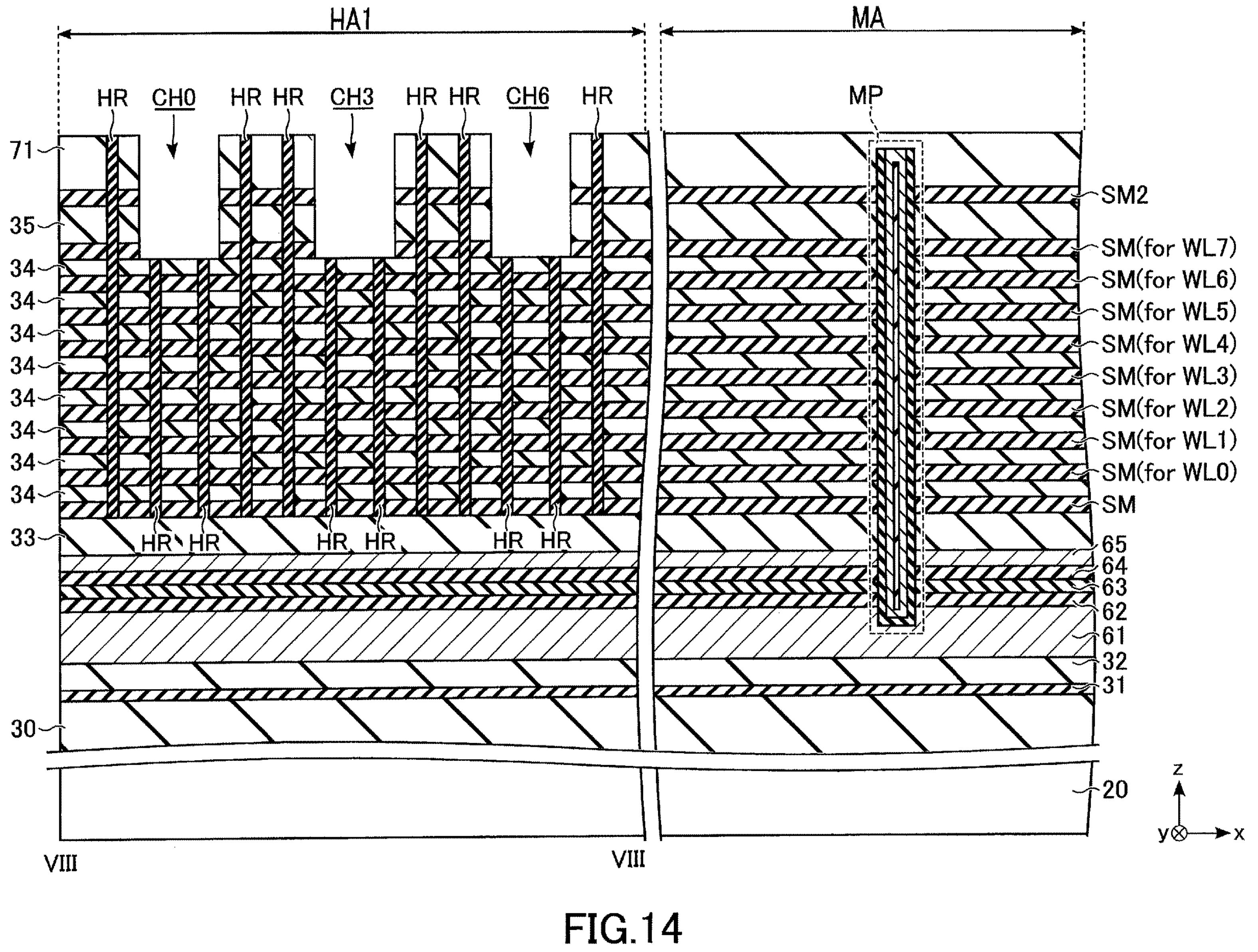

As illustrated in FIG. 14, in the steps described with reference to FIG. 14 and the drawings that follow, bottoms of the contact holes CH7 and CH8 (not illustrated) are lowered to intended depths. During this, a contact hole CH that has an intended depth that is smaller than the intended depths of the contact holes CH7 and CH8 is filled with a filling member NG (not illustrated). On the other hand, bottoms of contact holes CH that have an intended depth that is greater than the intended depths of the contact holes CH7 and CH8, that is, the contact holes CH0 to CH5, reach a deeper position due to etching. As a result of this, the contact holes CH0 to CH6 reach an upper face of an insulator 34 on an upper face of an insulator SM that is located in an area where the conductor 23 that functions as the word line WL6 is to be formed.

Figure 15:
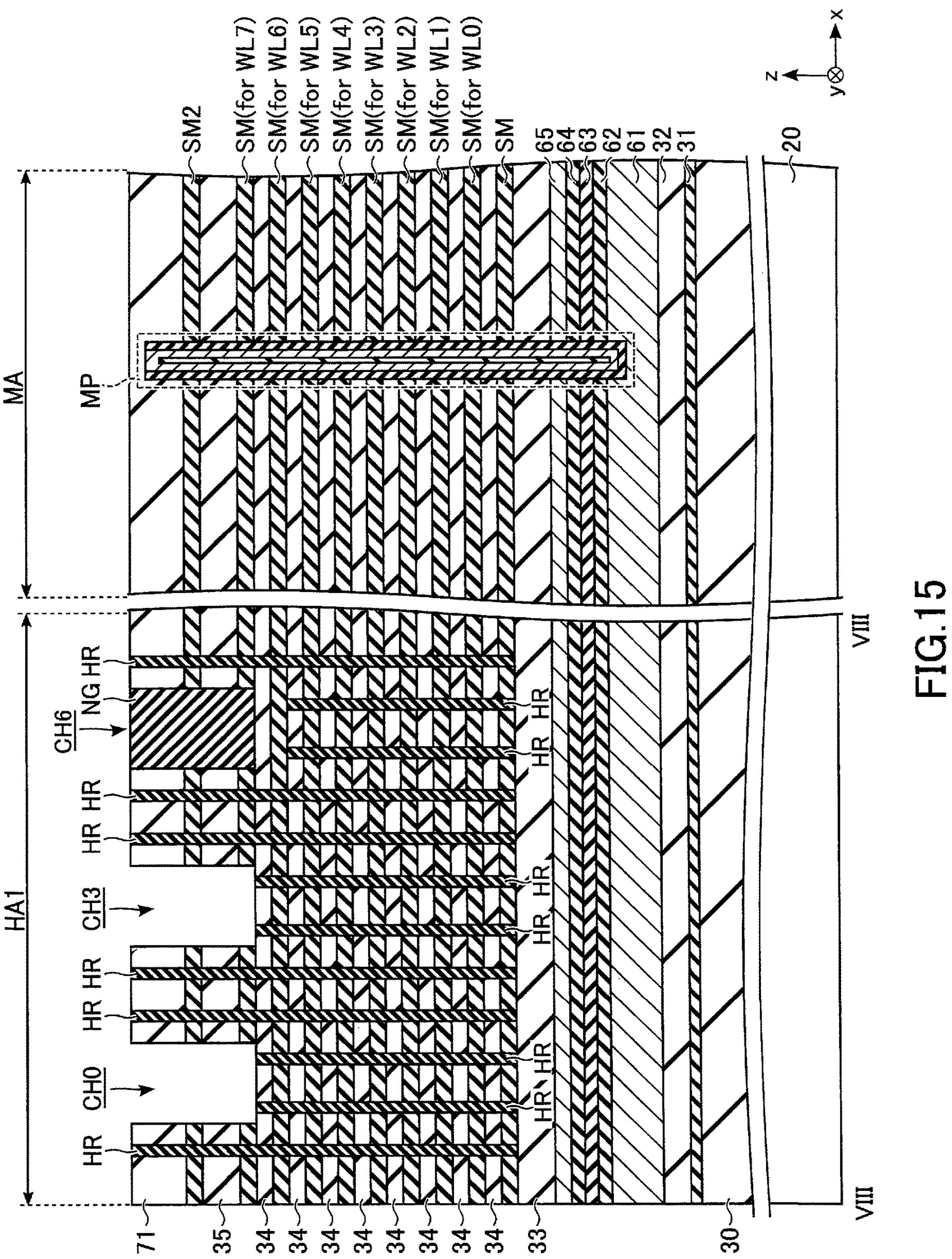

As illustrated in FIG. 15, the contact hole CH6 is filled with the filling member NG. The filling member NG is, for example, a negative resist. Specifically, the negative resist is applied to an upper face of a structure obtained by performing the processes so far. Next, on the upper face of the structure, the mask that includes an opening is formed above an area that is to be filled with the filling member NG, that is, the contact hole CH6. The negative resist is exposed to light by using the opening of the mask. As a result of this, a portion below the opening of the mask in the negative resist, that is, a portion in the contact hole CH6, is cured. Then, a portion that has not been cured of the negative resist is removed.

Figure 16:
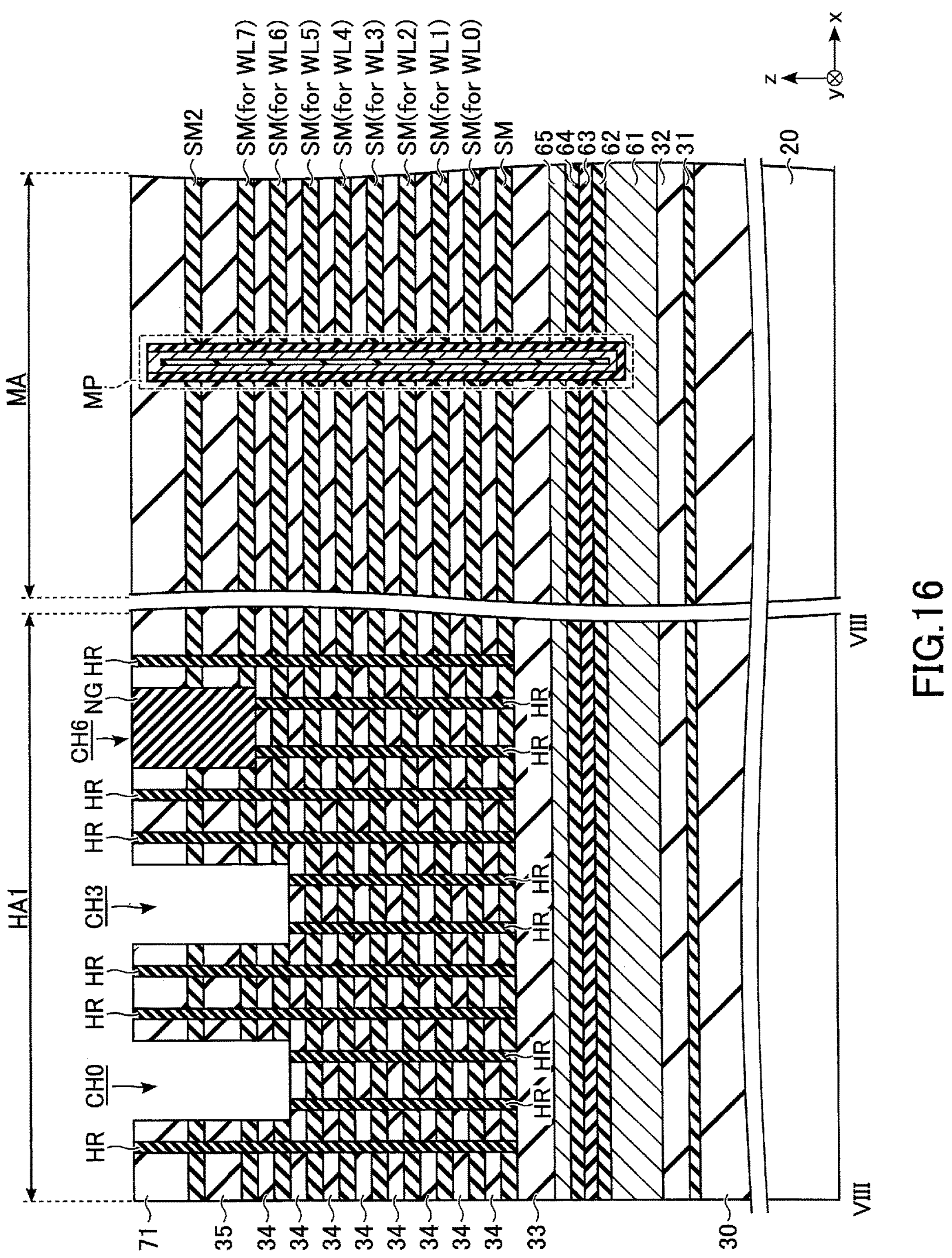
Figure 17:
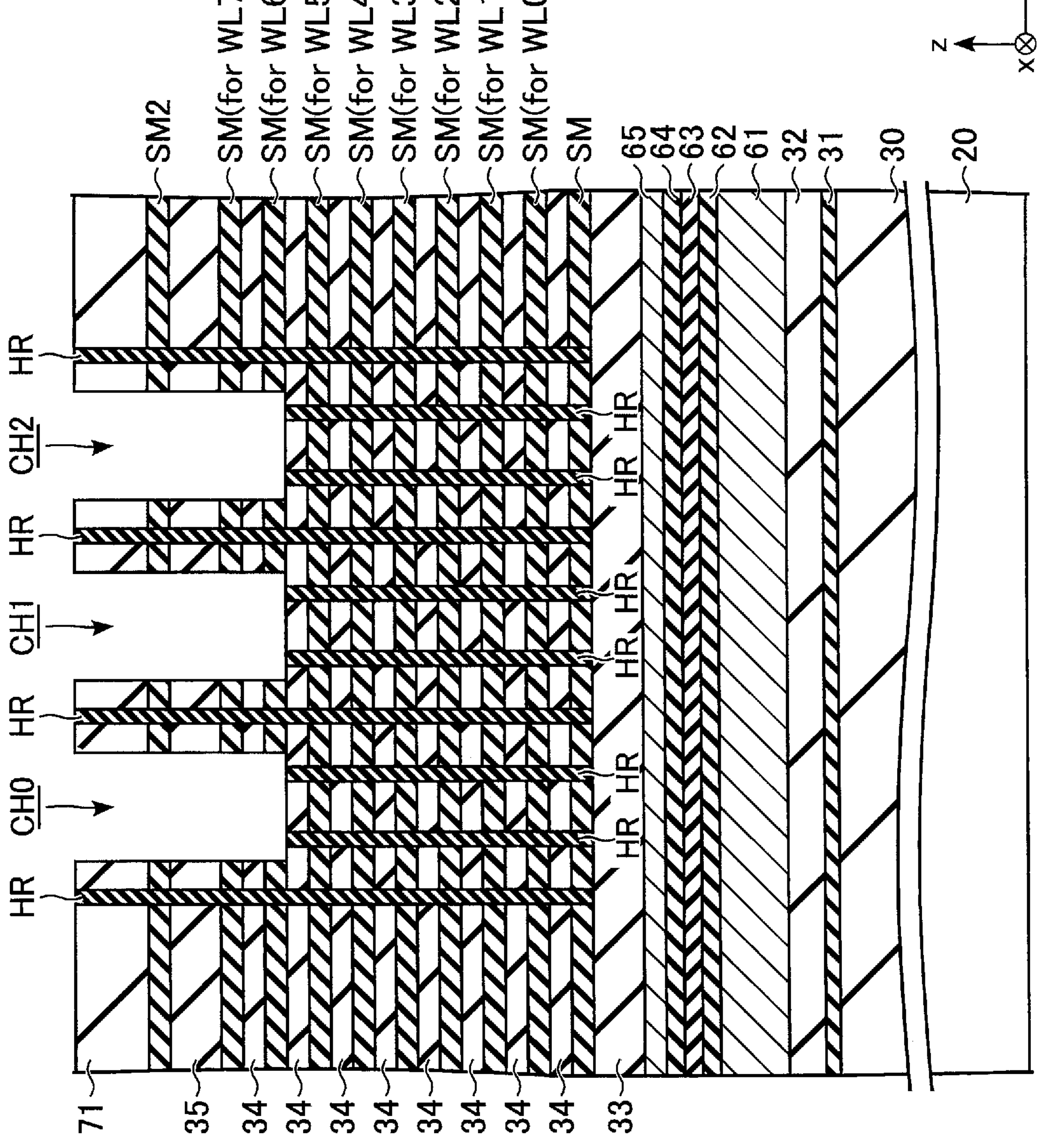

As illustrated in FIGS. 16 and 17, anisotropic etching is performed on a structure obtained by performing the processes so far. Etching is performed under a condition in which a set of the insulators SM and 34 and the filling member NG have a high selection ratio. As a result of this, bottoms of contact holes CH that are not filled with the filling member NG, that is, the contact holes CH0 to CH5, are etched. By performing etching, the bottoms of the contact holes CH0 to CH5 reach an upper face of an insulator 34 on an upper face of an insulator SM that is located in an area where the conductor 23 that functions as the word line WL5 is to be formed.

Figure 18:
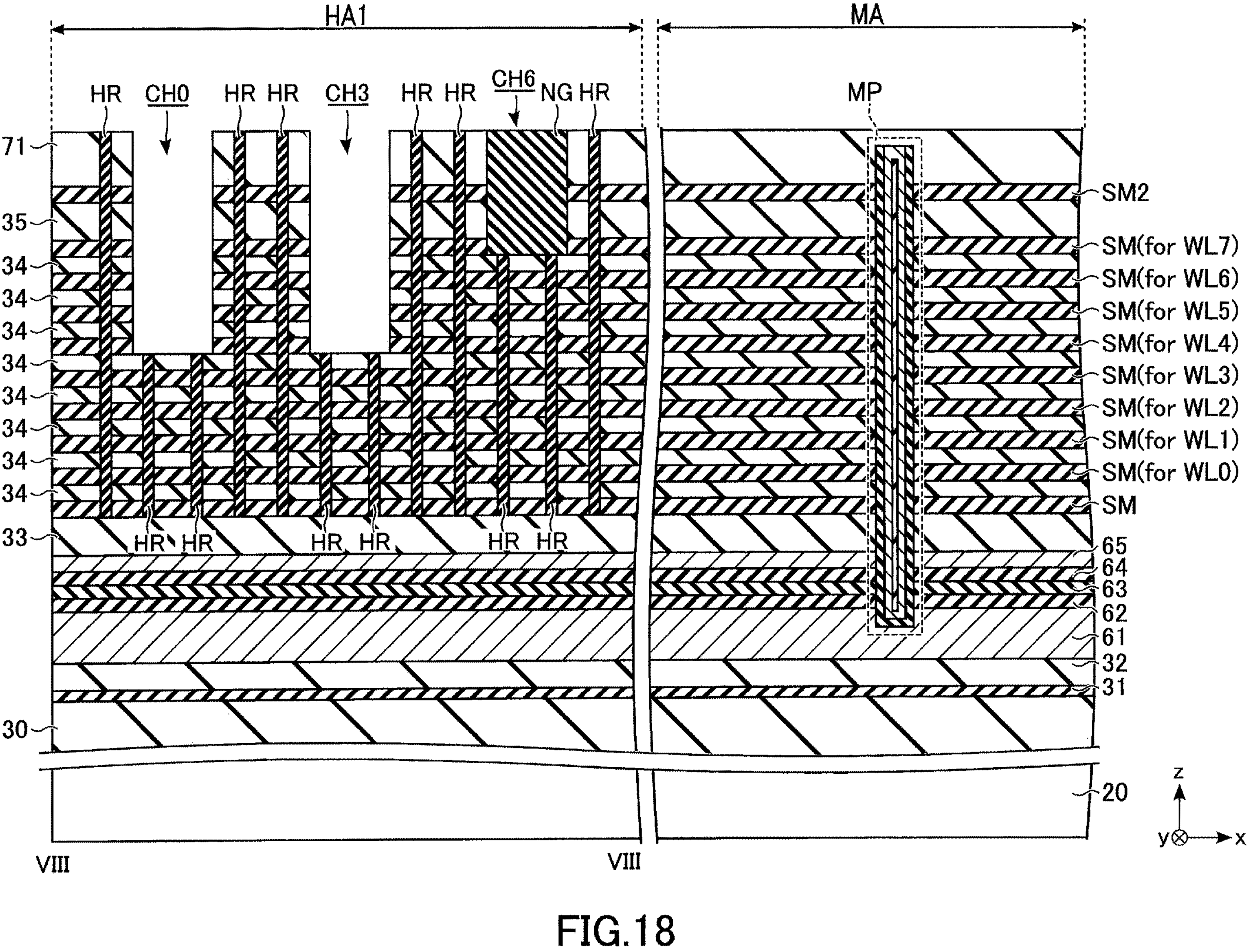
Figure 19:
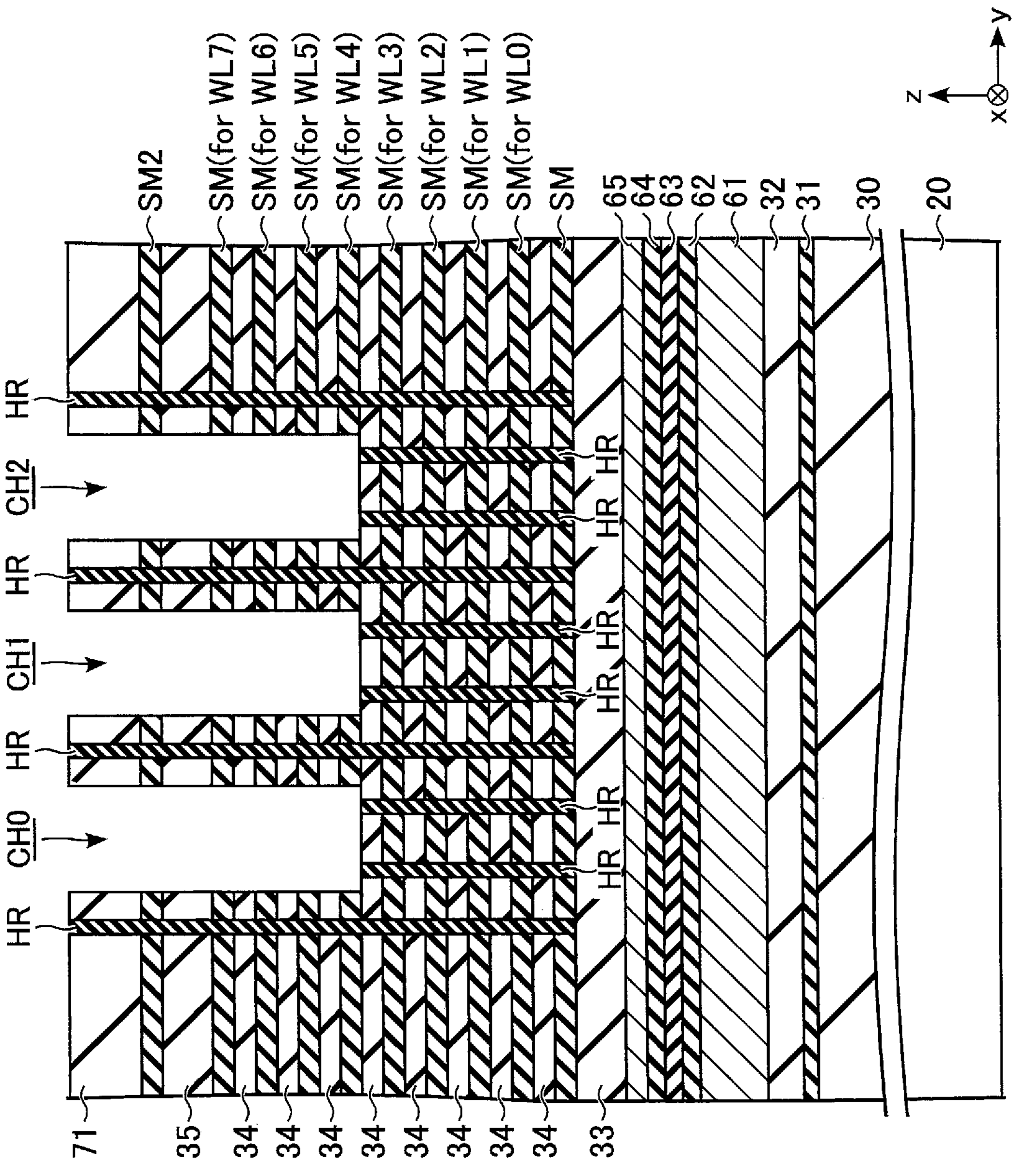

As illustrated in FIGS. 18 and 19, steps that are similar to the steps described with reference to FIGS. 15 to 17 are repeated, and therefore the bottoms of the contact holes CH0 to CH4 are etched. In this process, the contact hole CH4 reaches an intended depth, and then the contact hole CH4 is filled with the filling member NG. By performing etching while filling the contact hole CH that has reached an intended depth, the bottoms of the contact holes CH0 to CH3 reach an upper face of an insulator 34 on an upper face of an insulator SM that is located in an area where the conductor 23 that functions as the word line WL3 is to be formed.

Figure 20:
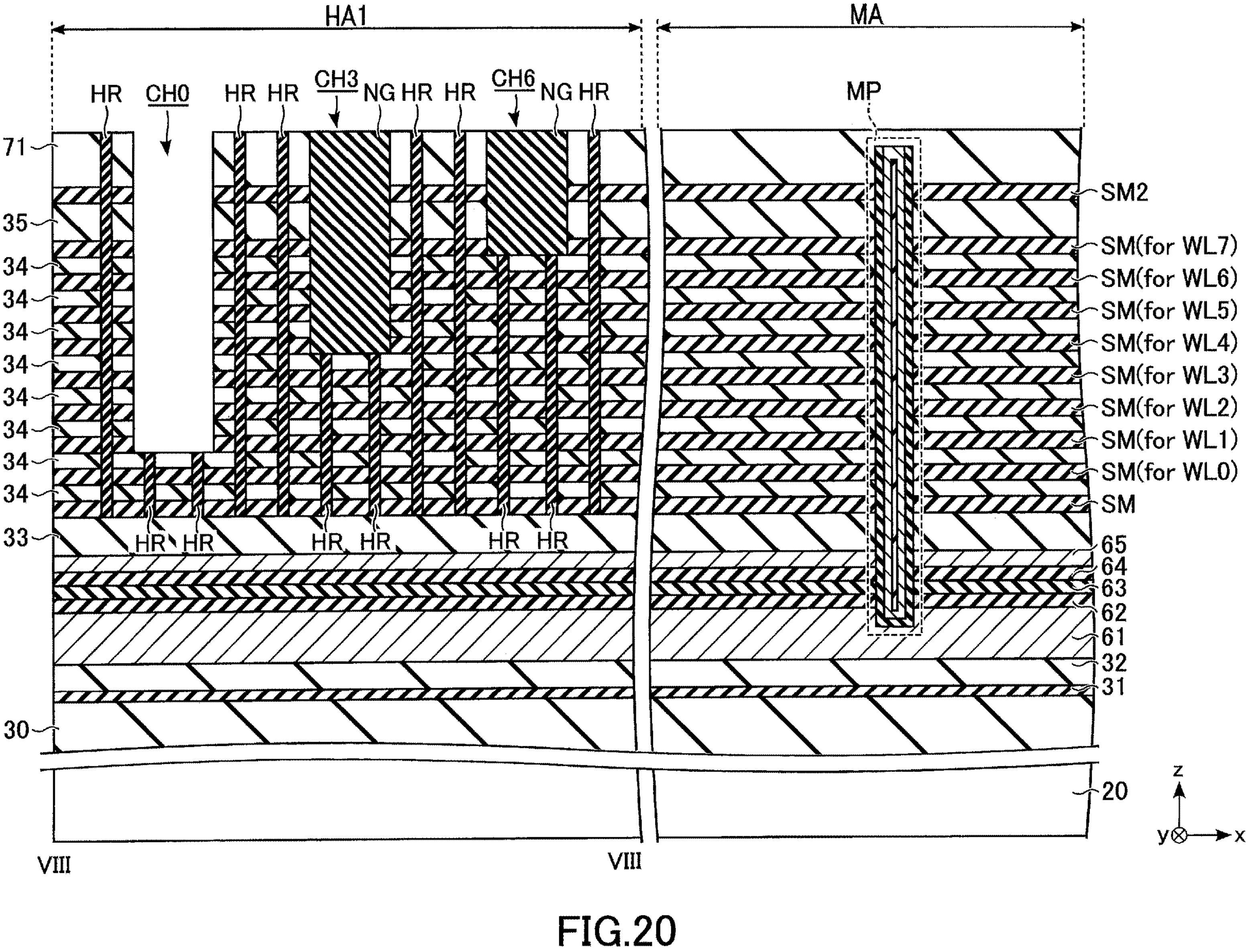
Figure 21:
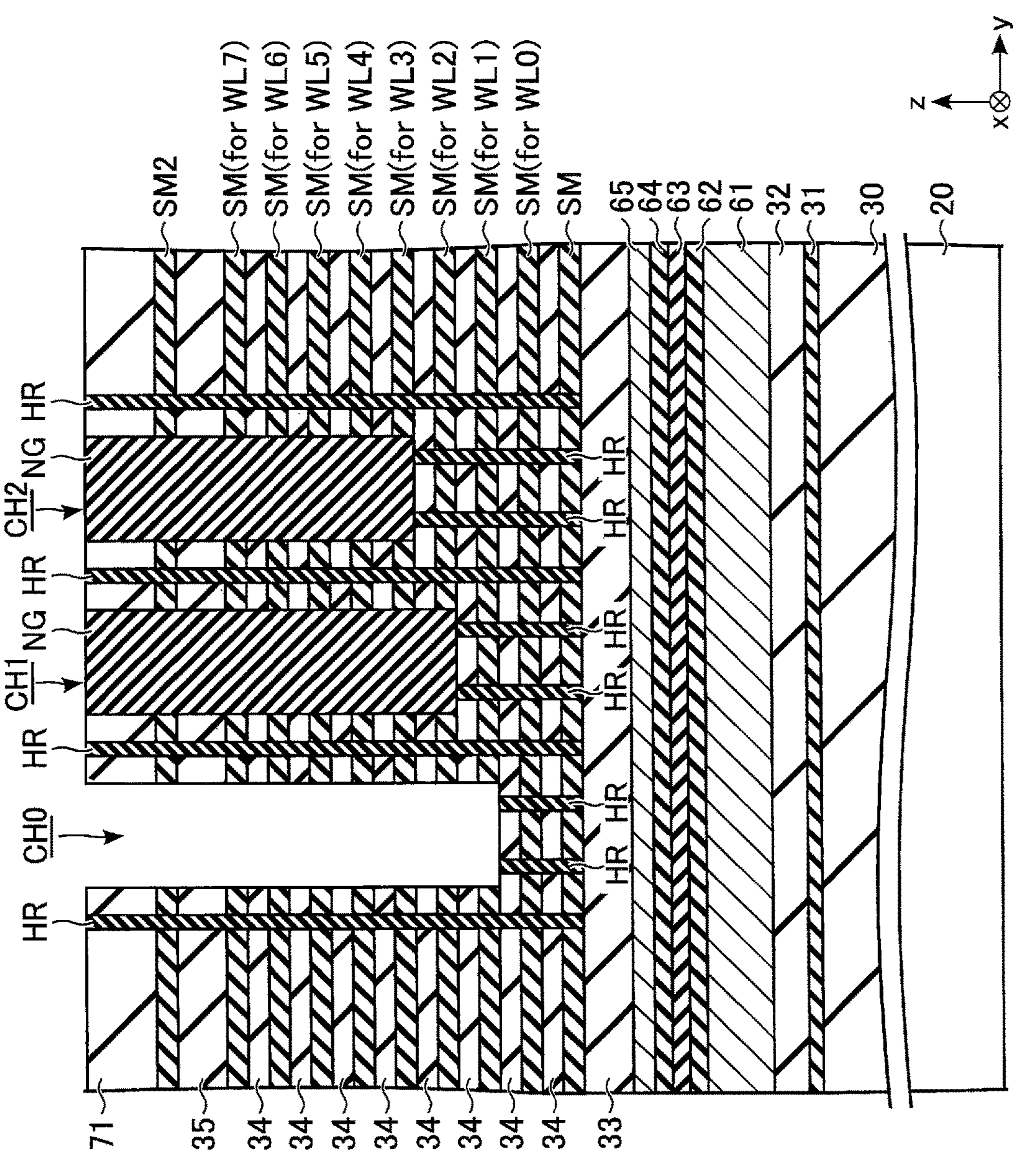

As illustrated in FIGS. 20 and 21, steps that are similar to the steps described with reference to FIGS. 15 to 17 are repeated, and therefore the bottoms of the contact holes CH0 to CH2 are etched by performing etching while filling the contact hole CH that has reached an intended depth. As a result of this, the bottoms of the contact holes CH0 to CH2 respectively reach upper faces of insulators 34 on upper faces of insulators SM that are located in areas where the conductors 23 that function as the word lines WL0, WL1, and WL2 are to be formed.

Figure 22:
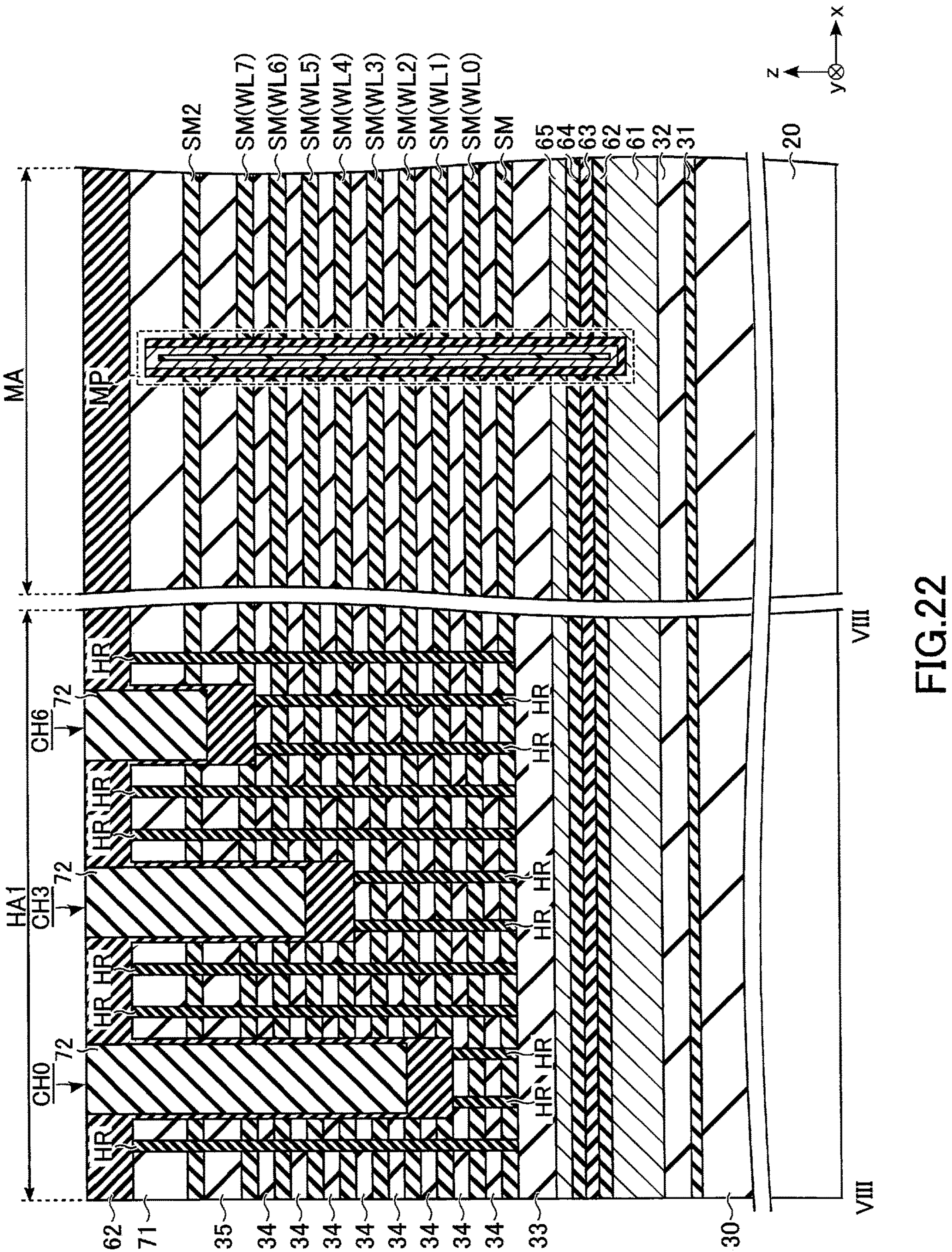

As illustrated in FIG. 22, the filling member NG in each of the contact holes CH is removed. Removal can be performed by performing wet etching or ashing. The insulator 62 is deposited on the entirety of an upper surface of a structure obtained by performing the steps so far. The insulator 62 covers a side face and a bottom face of each of the contact holes CH. The insulator 62 further covers the upper face of the insulator 71, and an upper face of a support pillar HR that does not overlap the contact hole CH.

The contact holes CH are filled with a filling member 72. The filling member 72 is, for example, amorphous silicon.

Figure 23:
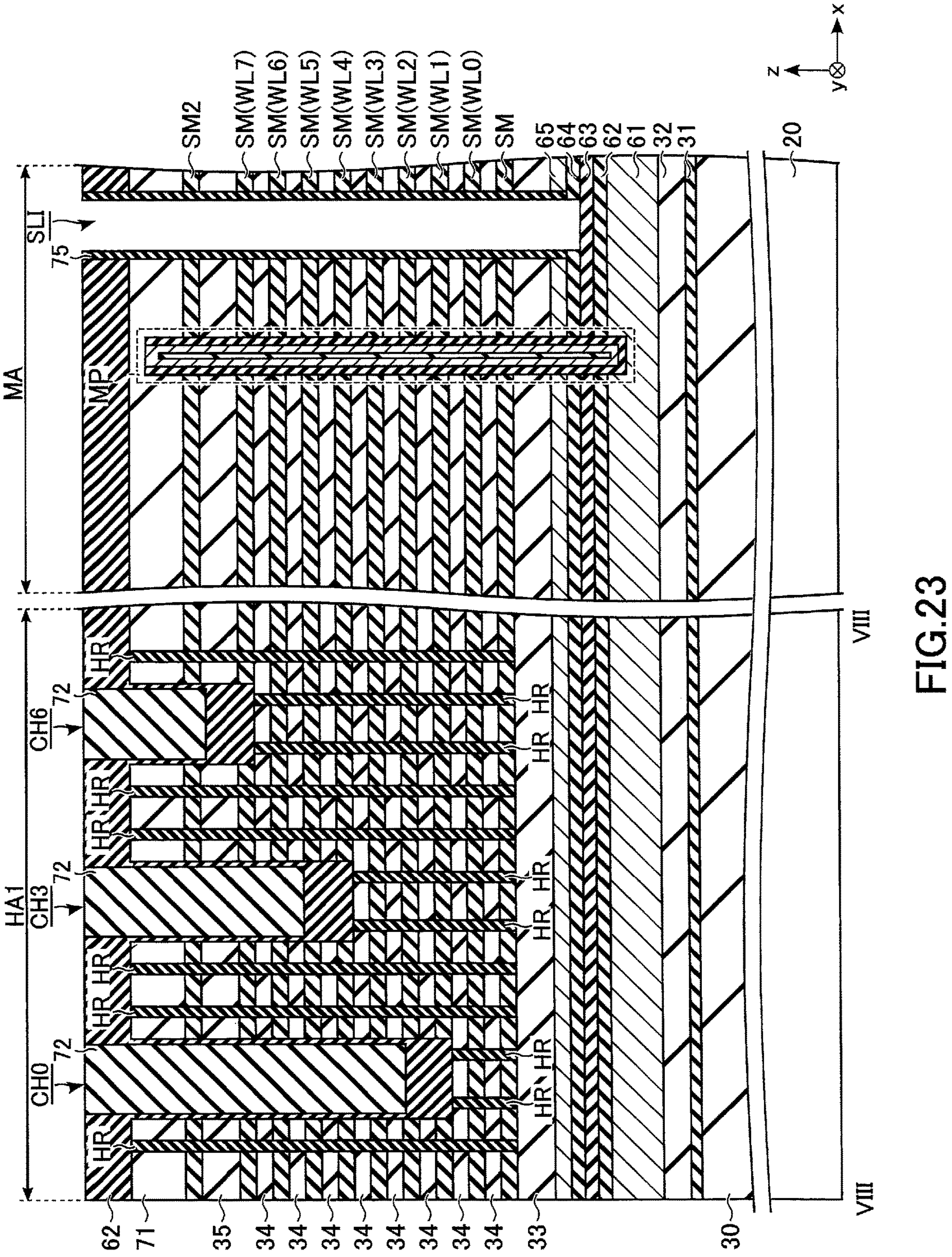

As illustrated in FIG. 23, photolithography and anisotropic etching are performed, and therefore a slit SLI is formed. The slit SLI is located in an area where the member SLT is to be formed. A bottom of the slit SLI reaches an upper face of the insulator 64. The insulator 75 is formed on a surface of the slit SLI. A portion of a bottom of the slit SLI in the insulator 75 and a portion below the slit SLI in the insulator 64 are removed. As a result of this, the insulator 63 is exposed in the bottom of the slit SLI.

Figure 24:
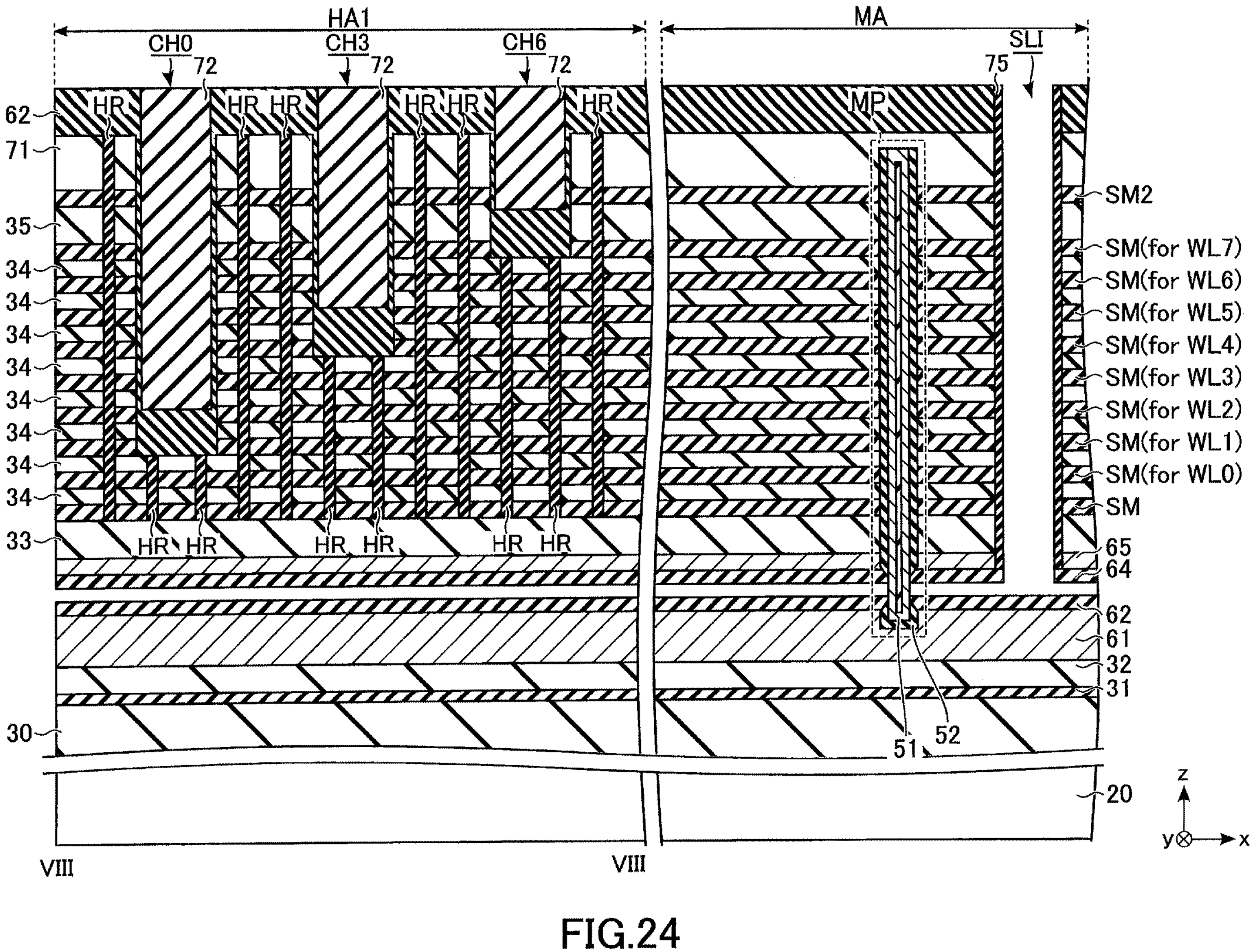

As illustrated in FIG. 24, wet etching is performed, and therefore the bottom of the slit SLI, that is, the insulator 63, is exposed to a chemical. The chemical removes the insulator 63. During this, in the layer stack 52 of the memory pillar MP, a portion that is located in a layer of the insulator 63 is removed, and the semiconductor 51 is exposed in the removed portion.

Figure 25:
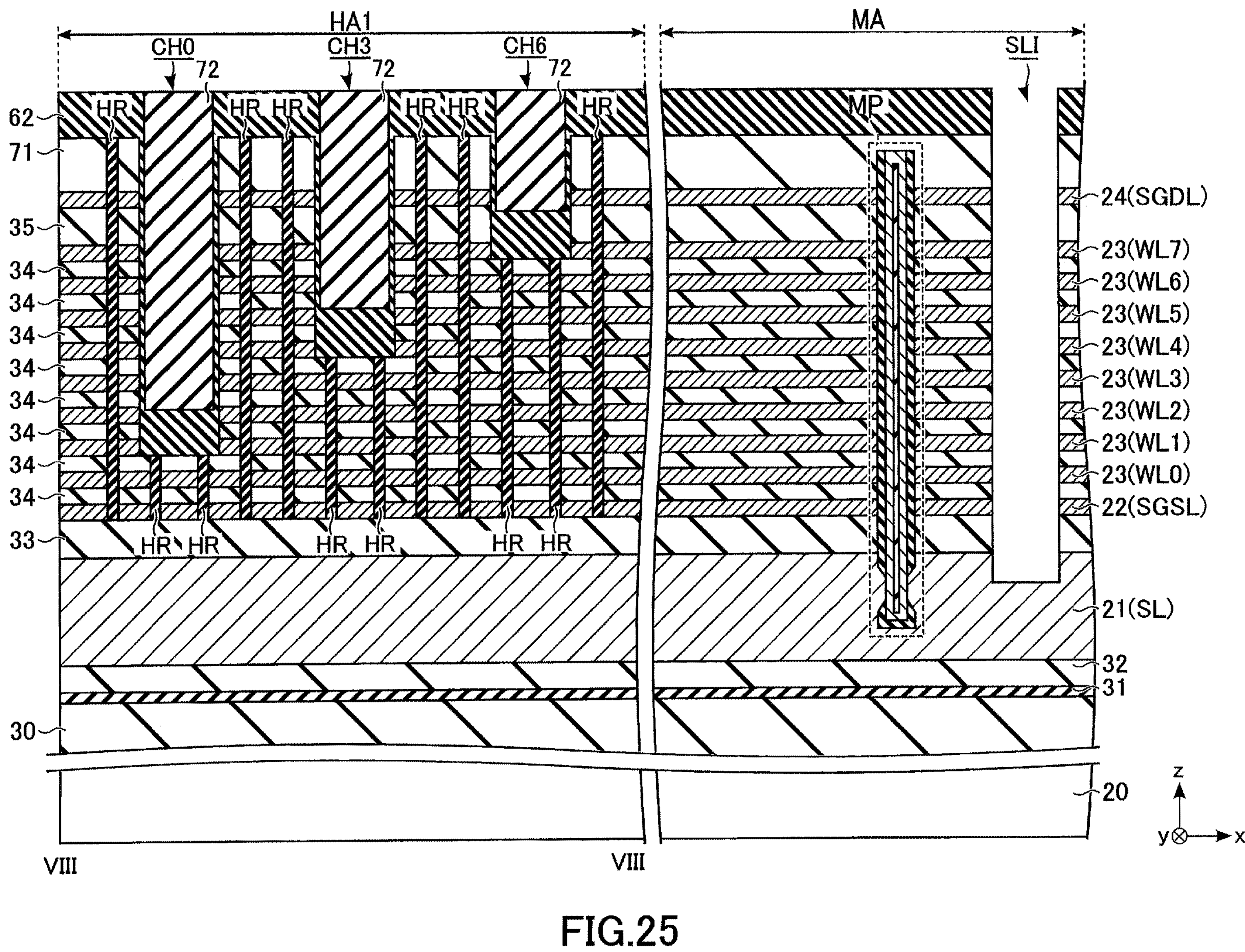

As illustrated in FIG. 25, wet etching is performed, and therefore a chemical advances from a space where the insulator 63 was located in the bottom of the slit SLI. The chemical removes the insulators 62 and 64. A space where the insulators 62 and 64 were located is filled with a conductor, and therefore the conductor 21 is formed.

The insulator 75 is removed. The insulator 75 is removed, and therefore the insulators SM and SM2 are exposed in the slit SLI. Wet etching is performed, and therefore the exposed portions of the insulators SM and SM2 are exposed to a chemical. The chemical advances, and therefore the insulators SM and SM2 are removed, and an area where the insulators SM and SM2 were located is opened in the slit SLI. During this period, a space is formed in the area where the insulators SM and SM2 were located. This weakens a structure during this period of the memory device 1 during manufacturing, and in particular, a portion having a high aspect ratio in the structure becomes unstable. In view of this, a large number of support pillar HR are provided, and therefore a shape of the structure is prevented from collapsing.

The area where the insulators SM and SM2 were located is filled with a conductor from the opening of the slit SLI, and therefore the conductors 22, 23, and 24 are formed.

Figure 26:
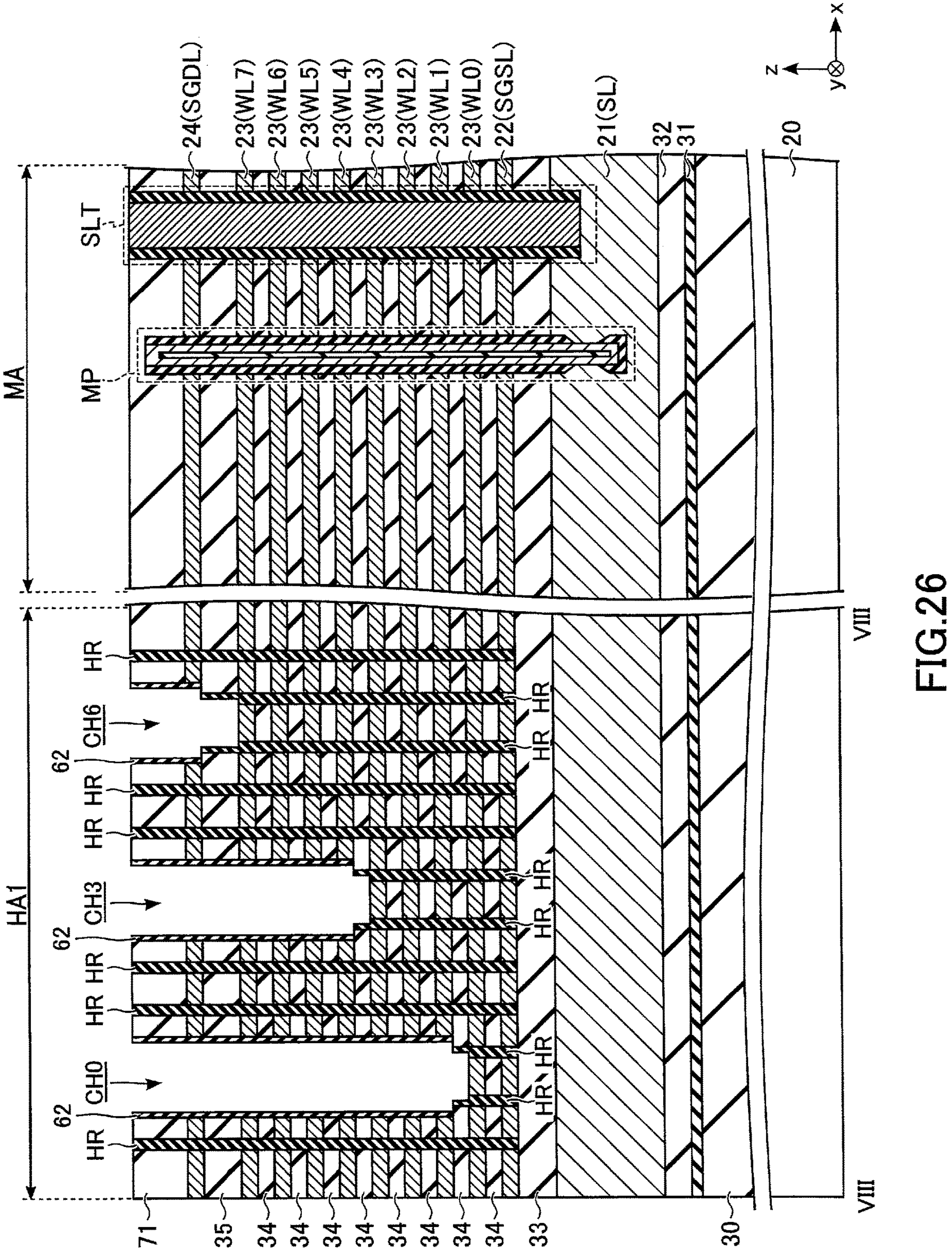

As illustrated in FIG. 26, a side face of the slit SLI is covered with the spacer SP. The slit SLI is filled with the conductor, and therefore the member SLT is formed.

The filling member 72 is removed. In the insulator 62, portions on the upper face of the insulator 71 and on an upper face of a support pillar HR that does not overlap the contact hole CH are removed. As a result of this, the insulator 62 remains on the side face and the bottom face of the contact hole CH. Anisotropic etching is performed on the bottom face of the contact hole CH. By doing this, in the insulator 62, a portion of the bottom face of the contact hole CH is removed. As a result of this, the insulator 34 is partially exposed on the bottom face of each of the contact holes CH.

Anisotropic etching is further performed on the bottom of the contact holes CH. By doing this, in each of the insulators 34, a portion below each of the contact holes CH is removed. By doing this, the conductor 23 is exposed in a bottom of each of the contact holes CH. During this etching, a support pillar HR that overlaps the contact hole CH is also partially removed. An upper face of the support pillar HR that was partially removed is aligned with an upper face of a single conductor 23.

As described with reference to FIG. 7, the support pillar HR is not located in a center of the contact plug CC. Therefore, during etching for coupling the bottom of the contact hole CH to the conductor 23, an area where the bottom of the contact hole CH is in contact with the support pillar HR is reduced.

Figure 27:
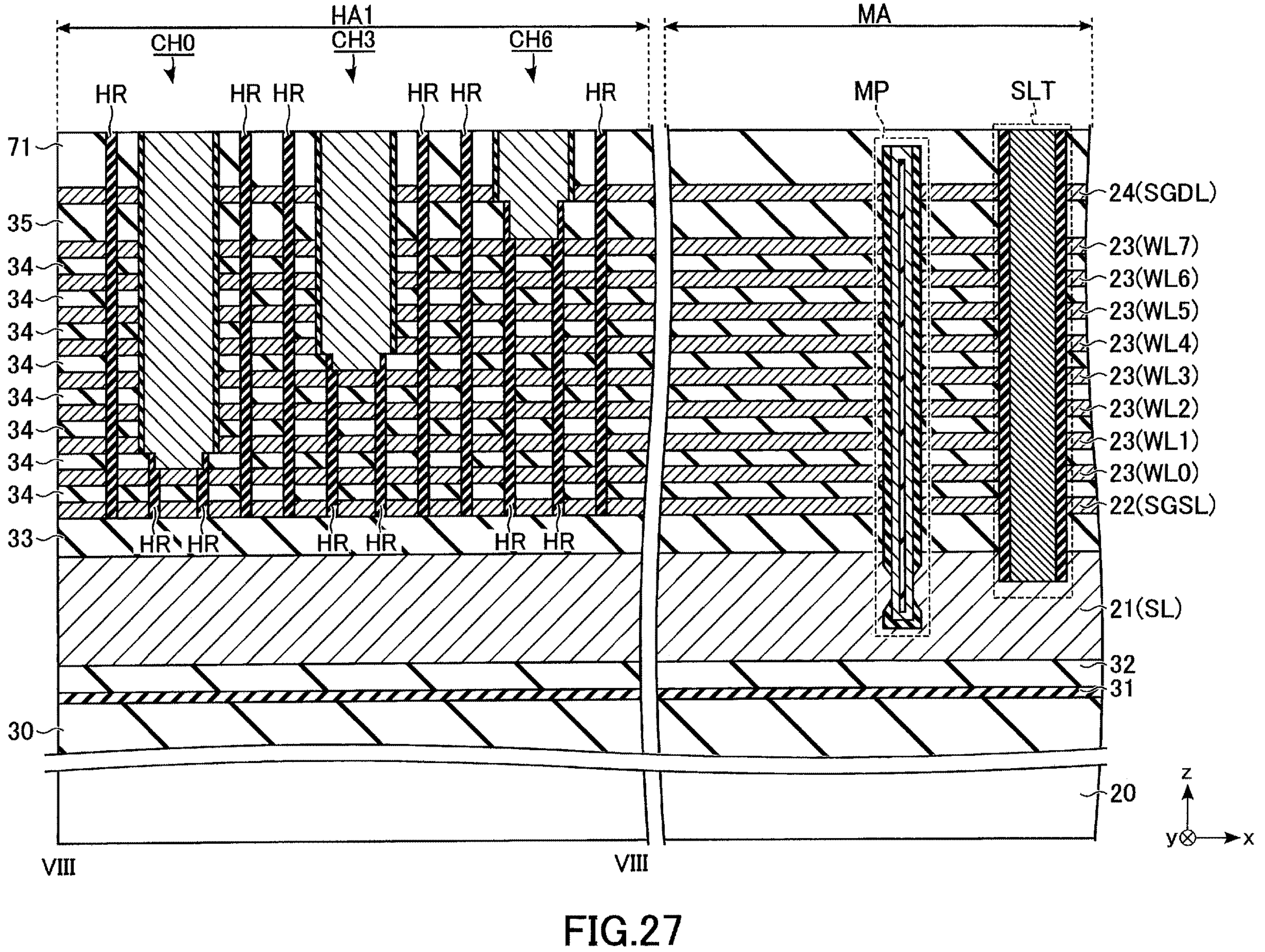

As illustrated in FIG. 27, the contact holes CH are filled with the conductor. By doing this, the contact plugs CC are formed.

A remaining portion of the insulator 36, the conductor 60, the contact plug CV, the conductor 25, and the insulator 37 are formed, and therefore the structure illustrated in FIGS. 8 and 9 is completed.

1.3. Advantages (Advantageous Effects)

According to the first embodiment, as described below, a memory device that includes a hookup area having a small area can be provided.

Figure 28:
FIG. 28 illustrates an example of a plane layout of part of a hookup area of a reference memory device.
Figure 28:
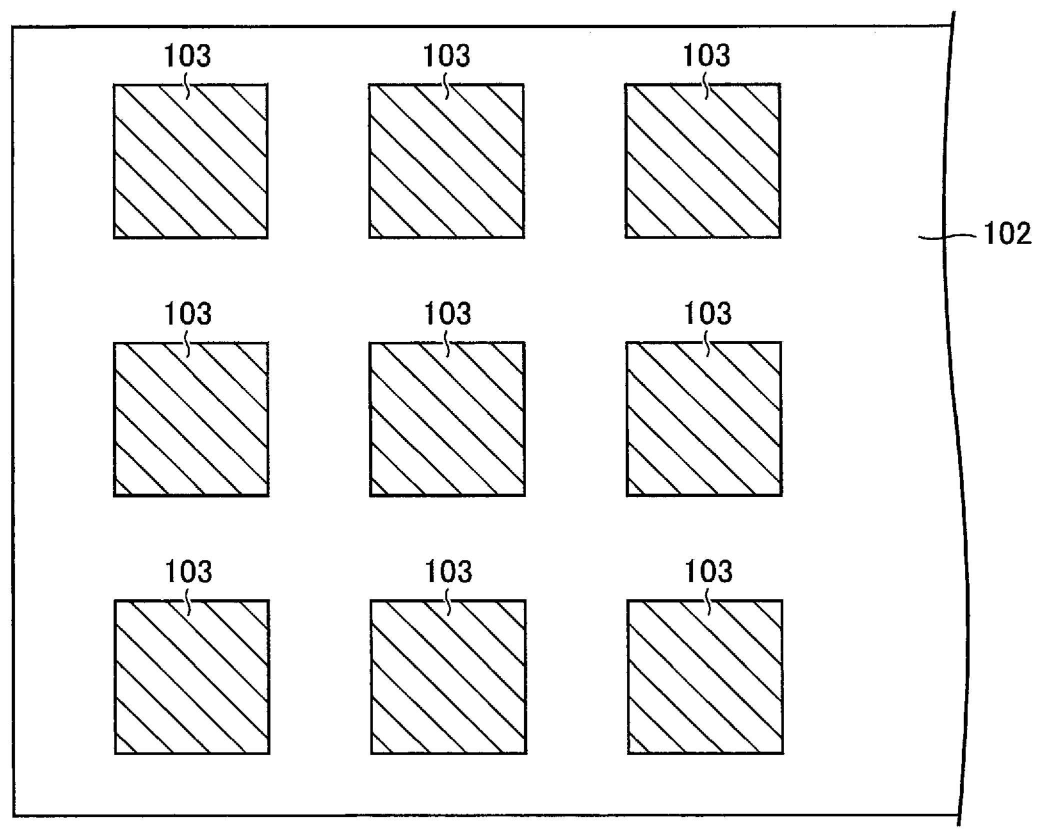

FIG. 28 illustrates a hookup area 101 of a reference memory device. In the hookup area 101, it is conceivable that contact plugs 103 that are in contact with a conductor 102 that corresponds to the conductor 23 of the first embodiment are disposed in a matrix shape. However, if a large number of conductors are provided for the purpose of an increase in a capacity of a memory device, a large number of contact plugs are required to correspond to the large number of conductors. Therefore, a hookup area needs to have a large area.

According to the first embodiment, the contact plugs CC are distributed in a staggered array. Therefore, the contact plugs CC are disposed closely in comparison with the disposition of the contact plugs 103. Accordingly, in a case where dimensions and in particular, a cross-sectional area along the xy-plane are the same between the contact plug 103 and the contact plug CC, a required area of the hookup area HA1 is smaller than a required area of the hookup area 101 in order to dispose the same number of contact plugs 103 or CC.

According to the first embodiment, the support pillar HR is not located in a center of the contact plug CC. Therefore, during etching for connecting the bottom of the contact hole CH to the conductor 23, an area where the bottom of the contact hole CH is in contact with the support pillar HR is reduced. Accordingly, in an area of a face along the xy-plane of the bottom of the contact hole CH, a portion that is in contact with the conductor 23 is prevented from decreasing. This keeps a resistance between the contact plug CC and the conductor 23 low.

2. Second Embodiment

A second embodiment is different from the first embodiment in a shape along an xy-plane of a contact plug CC.

Figure 29:
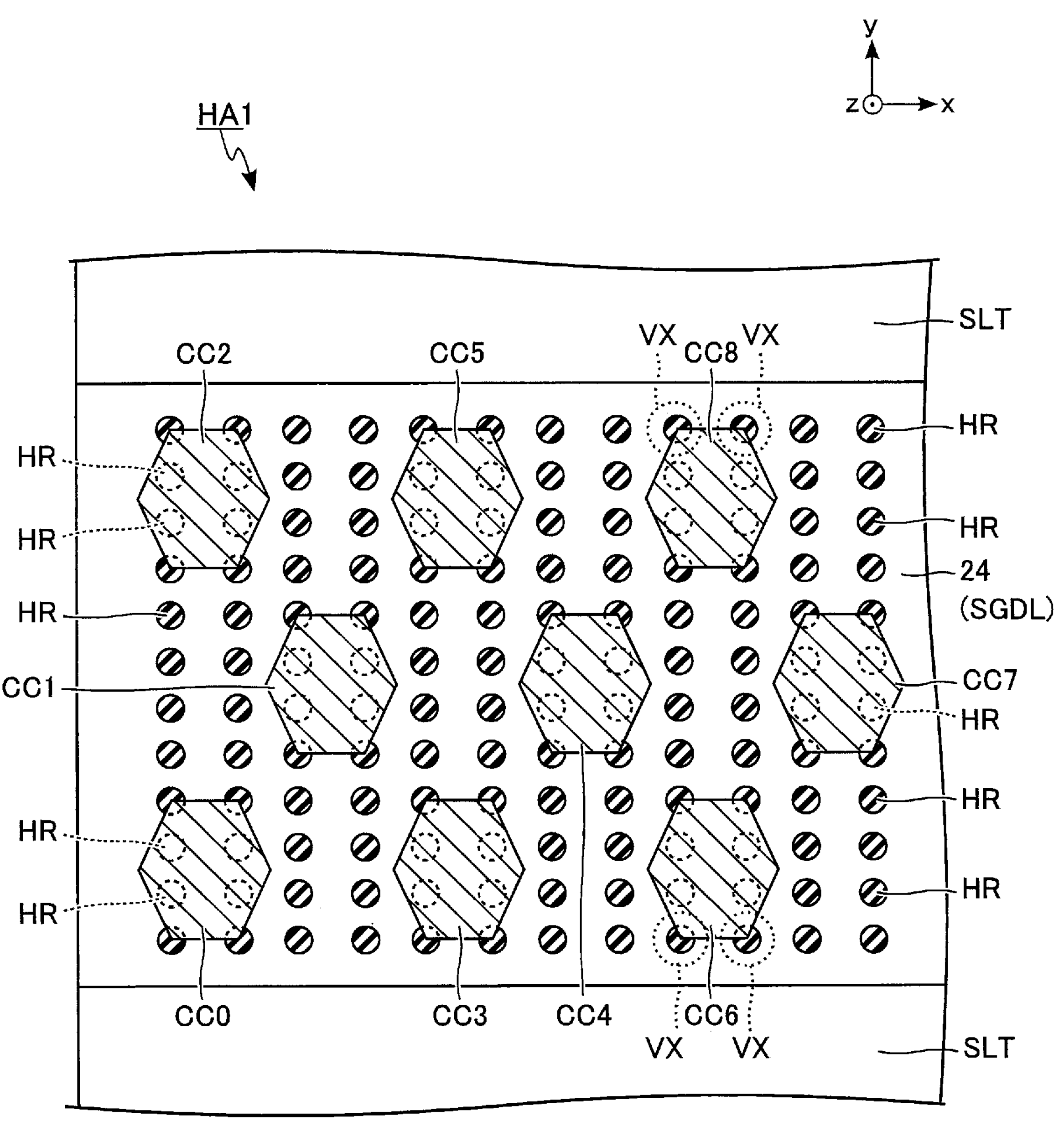
FIGS. 29 and 30 respectively illustrate examples of a plane layout of part of a hookup area of a memory device according to a second embodiment.

FIG. 29 illustrates an example of a plane layout of part of a hookup area of a memory device according to the second embodiment. FIG. 29 illustrates the same area as the area of the FIG. 7, and stated another way, part of an area between two members SLT is illustrated along the xy-plane. FIG. 29 illustrates a layout in a case where a layer including a conductor 24 is viewed from the above along a z-axis.

As illustrated in FIG. 29, each contact plug CC has a hexagonal shape. For example, in each of the contact plugs CC, certain two sides that face (are substantially parallel to) each other extend along an x-axis. Four remaining sides cross both the x-axis and a y-axis. In other words, each of the contact plugs CC has a shape obtained by cutting off four corners of a shape of the contact plug CC having a quadrangular shape in the first embodiment. Accordingly, a position of a vertex of each of the contact plugs CC is closer to a center than a position of a vertex of the contact plug CC having a quadrangular shape. Based on such a shape, a minimum spacing between adjacent contact plugs CC is large. The minimum spacing between the adjacent contact plugs CC is a length of a shortest virtual straight line of a plurality of virtual straight lines that connect respective edges of two adjacent contact plugs CC. A minimum spacing between two contact plugs CC in the second embodiment is a distance between respective vertexes that face each other of the two contact plugs, based on a fact that the contact plugs CC are disposed in the same manner as the disposition of the first embodiment, and have a hexagonal shape.

The disposition of the contact plugs CC is the same as the disposition in the first embodiment, and stated another way, the contact plugs CC are distributed in a staggered array.

A support pillar HR includes a support pillar HR that is located in an area near four vertexes VX of one or more contact plugs CC. The four vertexes VX are two vertexes VX formed by one of two sides that extend along the x-axis of the contact plug CC and another side, and two vertexes VX formed by the other of the two sides that extend along the x-axis of the contact plug CC and another side. The support pillar HR is located, for example, in an area near the four vertexes VX of each of the contact plugs CC.

The support pillar HR is located, for example, in an area that does not overlap the contact plug CC near one, two, three, or four of the four vertexes VX, in the case of being viewed along the xy-plane. Alternatively, the support pillars HR are located to include one, two, three, or four of the four vertexes VX, in the case of being viewed along the xy-plane. FIG. 29 illustrates this example. Alternatively, the support pillar HR is located in an area that completely overlaps the contact plug CC near one to four vertexes VX of the four vertexes VX, in the case of being viewed along the xy-plane.

The support pillar HR is not located in a center of one or more contact plugs CC, for example, each of the contact plugs CC.

The disposition of the support pillar HR can include one or more support pillars HR located at any other positions as long the disposition includes support pillars HR at one or more of the four vertexes VX of one or more contact plugs CC and does not include a support pillar HR in a center of the one or more contact plugs CC, for example, any of the contact plugs CC. FIG. 29 illustrates an example where the support pillars HR are disposed in a matrix shape.

According to the second embodiment, the contact plugs CC are disposed in the same manner as the disposition of the first embodiment. In addition, according to the second embodiment, similarly to the first embodiment, the support pillar HR is not located in a center of the contact plug CC. Therefore, the same advantages as the advantages of the first embodiment are achieved.

Moreover, according to the second embodiment, as described below, a memory device having a structure in which a difference from a designed and expected structure is suppressed can be provided. In a case where a contact hole CH is formed by using the method described with reference to FIGS. 12 to 21 of the first embodiment, in a formation process, a state where part of a structure of insulators 34, SM, and SM2 (hereinafter referred to as a "stacked structure" in some cases) has a high aspect ratio can occur. For example, this corresponds to the state of FIG. 19, and if a large number of conductors 23 are provided for the purpose of an increase in a capacity of a memory device, an aspect ratio is higher. The aspect ratio depends on a distance between adjacent contact holes CH.

According to the second embodiment, each of the contact plugs CC has a hexagonal shape. A minimum spacing between contact plugs CC is a distance between a vertex VX of one contact plug CC and a vertex VX of another contact plug CC. Therefore, a minimum spacing between adjacent contact plugs CC is wide, and is wider than a minimum spacing between adjacent contact plugs CC in a case where the contact plugs CC have a quadrangular shape. Therefore, an aspect ratio of part of a stacked structure generated in a process of forming the contact hole CH is smaller than an aspect ratio of part of a stacked structure in a case where the contact plug CC has a quadrangular shape. Accordingly, part of the stacked structure is stable, and is stable in comparison with at least a case where the contact plug CC has a quadrangular shape. This avoids a situation where a structure collapses in a process of manufacturing a memory device 1, and as a result, a structure of the completed memory device 1 is different from a designed and expected structure.

As described above, according to the second embodiment, a minimum spacing between contact plugs CC is a distance between respective vertexes that face each other of two contact plugs that are obliquely arranged, based on a fact that the contact plugs CC are disposed in the same manner as the first embodiment. Therefore, a distance between two adjacent rows of contact plugs CC is smaller than a distance between two adjacent rows in the reference memory device. Here, a distance between two adjacent rows of contact plugs is a difference between a coordinate of a center on a y-axis of one row of contact plugs CC and a coordinate of a center on the y-axis of another row of contact plugs CC. Based on a fact that minimum spacings of contact plugs CC are obliquely arranged, even if a distance between two adjacent rows of contact plugs CC is smaller than a distance between adjacent rows of contact plugs 103 of the reference memory device, a minimum spacing that is the same as a minimum spacing between the contact plugs 103 of the reference memory device can be maintained. Accordingly, according to the second embodiment, the contact plugs CC can have a minimum spacing that is similar to the minimum spacing between the contact plugs 103 in the reference memory device, and can be disposed more closely than the contact plugs 103 in the reference memory device. Stated another way, according to the second embodiment, both a strength of a structure that is similar to a strength of the reference memory device and a hookup area HA having an area that is smaller than an area of the hookup area 101 of the reference memory device can be achieved.

Figure 30:
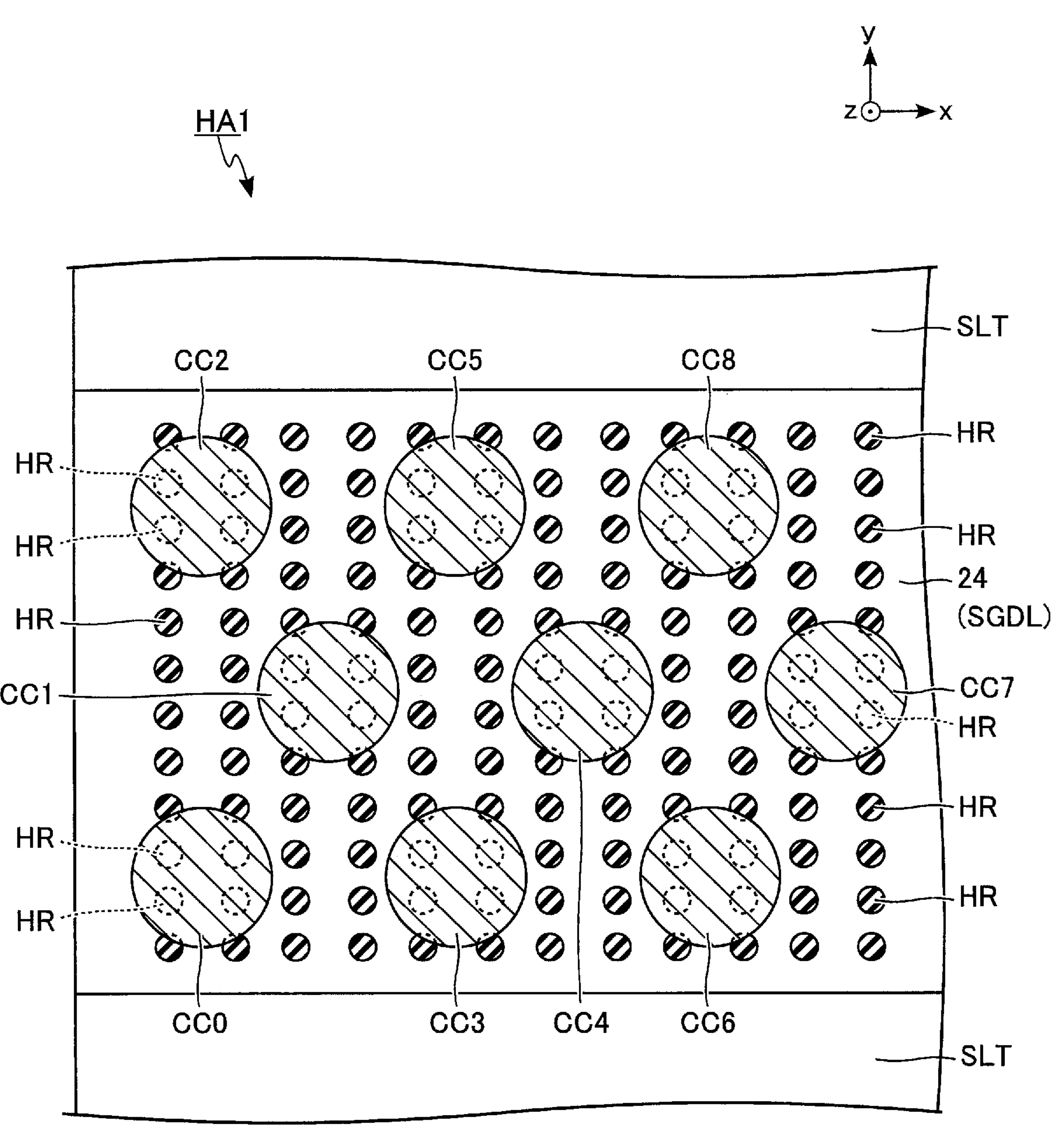

The contact plug CC of the second embodiment may have a circular shape along the xy-plane, as illustrated in FIG. 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:

a plurality of first conductors that are arranged along a first axis at intervals;

a memory pillar that extends along the first axis, faces the plurality of first conductors, and includes a semiconductor and a film that surrounds the semiconductor; and a plurality of contact plugs that extend along the first axis, wherein each of the contact plugs includes a second conductor and a first insulator that surrounds the second conductor, the first insulator is located between the plurality of first conductors and the second conductor, a lower face of each of the contact plugs is in contact with an upper face of a unique one of the plurality of first conductors, the contact plugs include a first contact plug, a second contact plug, a third contact plug, a fifth contact plug, and a sixth contact plug, the first contact plug and the second contact plug are disposed along a second axis to be adjacent to each other, the second axis crossing the first axis, the fifth contact plug and the sixth contact plug are disposed along the second axis to be adjacent to each other, the first contact plug and the fifth contact plug are disposed along a third axis to be adjacent to each other, the third axis being orthogonal to the first axis and the second axis, the second contact plug and the sixth contact plug are disposed along the third axis, and the third contact plug is located between the first contact plug and the second contact plug on the second axis and between the fifth contact plug and the sixth contact plug on the second axis, and is disposed in a different position from positions of the first contact plug, the second contact plug, fifth contact plug, and the sixth contact plug on the third axis, wherein each of the contact plugs has a hexagonal shape along a first plane including the second axis and the third axis, the memory device further includes a plurality of insulators that extend along the first axis, and penetrate the plurality of first conductors, the insulators are located in an area that deviates from a center of a shape of each of the contact plugs, one of the insulators at least partly overlaps with one of the contact plugs along the first plane, and one of the insulators at least partly overlaps with a vertex of the one of the contact plugs along the first plane.

2. The memory device according to claim 1, wherein the contact plugs further include a fourth contact plug, the third contact plug and the fourth contact plug are disposed along the second axis to be adjacent to each other, and the second contact plug is located between the third contact plug and the fourth contact plug on the second axis.

3. The memory device according to claim 1, further comprising:

a second insulator that extends along the first axis, includes an upper end that is located above an uppermost of the plurality of first conductors, and includes a lower end that is in contact with lowermost one of the plurality of first conductors; and a plurality of third insulators that extend along the first axis, includes an upper end that is in contact with a lower face of one of the contact plugs, and includes a lower end that is in contact with the lowermost one of the plurality of first conductors, the third insulators being located in an area that deviates from a center of a shape of each of the contact plugs.

4. The memory device according to claim 3, wherein one of the third insulators at least partly overlaps with one of the contact plugs along the first plane.

5. A memory device comprising:

a plurality of first conductors that are arranged along a first axis at intervals;

a memory pillar that extends along the first axis, faces the plurality of first conductors, and includes a semiconductor and a film that surrounds the semiconductor; and a plurality of contact plugs that extend along the first axis, wherein each of the contact plugs includes a second conductor and a first insulator that surrounds the second conductor, the first insulator is located between the plurality of first conductors and the second conductor, a lower face of each of the contact plugs is in contact with an upper face of a unique one of the plurality of first conductors, the contact plugs include a first contact plug, a second contact plug, a third contact plug, a fifth contact plug, and a sixth contact plug, the first contact plug and the second contact plug are disposed along a second axis to be adjacent to each other, the second axis crossing the first axis, the fifth contact plug and the sixth contact plug are disposed along the second axis to be adjacent to each other, the first contact plug and the fifth contact plug are disposed along a third axis to be adjacent to each other, the third axis being orthogonal to the first axis and the second axis, the second contact plug and the sixth contact plug are disposed along the third axis, and the third contact plug is located between the first contact plug and the second contact plug on the second axis and between the fifth contact plug and the sixth contact plug on the second axis, and is disposed in a different position from positions of the first contact plug, the second contact plug, fifth contact plug, and the sixth contact plug on the third axis, wherein each of the contact plugs has a hexagonal shape along a first plane including the second axis and the third axis, the memory device further comprises:

a second insulator that extends along the first axis, includes an upper end that is located above an uppermost of the plurality of first conductors, and includes a lower end that is in contact with lowermost one of the plurality of first conductors; and a plurality of third insulators that extend along the first axis, includes an upper end that is in contact with a lower face of one of the contact plugs, and includes a lower end that is in contact with the lowermost one of the plurality of first conductors, the third insulators being located in an area that deviates from a center of a shape of each of the contact plugs one of the third insulators at least partly overlaps with one of the contact plugs along the first plane, and one of the third insulators at least partly overlaps with a vertex of the one of the contact plugs along the first plane.

* * * * *